US012601044B2

(12) United States Patent
Hoshino et al.

(10) Patent No.: US 12,601,044 B2
(45) Date of Patent: Apr. 14, 2026

(54) GATE VALVE, SUBSTRATE PROCESSING APPARATUS, AND SUBSTRATE PROCESSING METHOD

(71) Applicants:KITZ SCT CORPORATION, Tokyo (JP); TOKYO ELECTRON LIMITED, Tokyo (JP)

(72) Inventors: Yoshifumi Hoshino, Gunma (JP); Kaito Suzuki, Gunma (JP); Yukio Ohizumi, Iwate (JP)

(73) Assignees: KITZ SCT CORPORATION, Tokyo (JP); TOKYO ELECTRON LIMITED, Tokyo (JP)

( * ) Notice: Subject to any disclaimer, the term of this patent is extended or adjusted under 35 U.S.C. 154(b) by 151 days.

(21) Appl. No.: 18/236,058

(22) Filed: Aug. 21, 2023

(65) Prior Publication Data

US 2024/0068090 A1      Feb. 29, 2024

(30) Foreign Application Priority Data

Aug. 30, 2022    (JP) ................................. 2022-136598

(51) Int. Cl.
    *C23C 14/56* (2006.01)
    *F16K 3/02* (2006.01)
(52) U.S. Cl.
    CPC .......... *C23C 14/564* (2013.01); *F16K 3/0209* (2013.01)
(58) Field of Classification Search
    CPC .... F16K 3/0209; F16K 3/0227; F16K 3/0281;

F16K 51/02; F16K 27/044; F16K 27/08; F16K 31/122; F16K 41/02; F16K 41/10; C23C 14/564; C23C 16/4401;

(Continued)

(56) References Cited

U.S. PATENT DOCUMENTS

| 4,643,395 A | * | 2/1987 | Williams, Jr. | ........ | F16K 3/0236 |
| | | | | | 251/327 |
| 2014/0003892 A1 | | 1/2014 | Yamamoto et al. | | |

(Continued)

FOREIGN PATENT DOCUMENTS

JP            5806827        11/2015

*Primary Examiner* — Craig M Schneider
*Assistant Examiner* — Andrew J Rost
(74) *Attorney, Agent, or Firm* — Wenderoth, Lind & Ponack, L.L.P.

(57)            ABSTRACT
A gate valve, a substrate processing apparatus, and a substrate processing method which can improve the airtightness and cleanliness of a vacuum processing chamber and a vacuum preliminary chamber. A gate valve has a face facing a vacuum processing chamber and a face facing a vacuum preliminary chamber, the faces abutting on annular sealing members surrounding entire circumferences of substrate loading/unloading ports of the vacuum processing chamber and the vacuum preliminary chamber, and openably and closably connects the vacuum processing chamber and the vacuum preliminary chamber. The gate valve includes sealing channels provided between the sealing members doubly provided outside and inside surrounding the entire circumference of at least one of the substrate loading/unloading ports and between other sealing members doubly provided outside and inside in one or more parts inside the gate valve, and a gas circulation channel including the sealing channels.

5 Claims, 14 Drawing Sheets

(58) Field of Classification Search
CPC ......... H01L 21/67126; H01L 21/67155; H01L
21/67196
See application file for complete search history.

(56) References Cited

U.S. PATENT DOCUMENTS

| | | | |
|---|---|---|---|
| 2015/0316155 A1* | 11/2015 | Ishigaki | F16K 3/184 |
| | | | 251/328 |
| 2019/0032795 A1* | 1/2019 | Shimoda | F16K 27/003 |
| 2021/0062921 A1* | 3/2021 | Saitou | F16K 3/0281 |

* cited by examiner

GATE VALVE, SUBSTRATE PROCESSING APPARATUS, AND SUBSTRATE PROCESSING METHOD

BACKGROUND OF THE INVENTION

Field of the Invention

The present invention relates to a gate valve, a substrate processing apparatus, and a substrate processing method. In particular, the present invention relates to a gate valve which openably and closably connects a vacuum processing chamber for processing a substrate such as a semiconductor wafer, a liquid crystal substrate, or a solar panel substrate and a vacuum preliminary chamber a substrate processing apparatus, and a substrate processing method.

Description of the Related Art

In conventional manufacture of a substrate such as a semiconductor wafer, a liquid crystal substrate, or a solar panel substrate, a depressurizable vacuum processing chamber for each process is provided to perform various processes on the substrate.

This vacuum processing chamber needs to maintain a predetermined degree of vacuum and cleanliness according to processing details to ensure stable quality.

For example, in a substrate processing apparatus which includes a plurality of vacuum processing chambers to perform various processes on a semiconductor wafer, the substrate is transferred to the vacuum processing chambers set at various degrees of vacuum to perform the processes thereon.

Thus, to prevent changes in the environment of the vacuum processing chamber caused by loading and unloading of the substrate, a vacuum preliminary chamber which can be maintained at the same degree of vacuum and cleanliness as the vacuum processing chamber is provided adjacent to the vacuum processing chamber, and the substrate is loaded into and unloaded from the vacuum processing chamber via the vacuum preliminary chamber.

The vacuum preliminary chamber is used to perform adjustment to bring the pressure closer to the vacuum atmosphere in the vacuum processing chamber and includes a chamber called a load lock chamber or a transfer chamber, or the other chambers.

A gate valve is provided between substrate loading/unloading ports of the vacuum processing chamber and the vacuum preliminary chamber, the substrate loading/unloading ports being disposed facing each other. The gate valve openably and closably connects the vacuum processing chamber and the vacuum preliminary chamber.

The gate valve has a face facing the vacuum processing chamber and a face facing the vacuum preliminary chamber, the faces abutting on annular sealing members surrounding the entire circumferences of the substrate loading/unloading ports disposed facing each other, and is provided between the vacuum processing chamber and the vacuum preliminary chamber.

That is, the substrate loading/unloading port of each of the vacuum processing chamber and the vacuum preliminary chamber is hermetically sealed by the annular sealing member surrounding the entire circumference thereof to prevent the entry of atmospheric air.

The substrate processing apparatus can load and unload the substrate into and from the vacuum processing chamber through the vacuum preliminary chamber while maintaining airtightness by the gate valve openably and closably connecting the vacuum processing chamber and the vacuum preliminary chamber with the substrate loading/unloading port of each of the vacuum processing chamber and the vacuum preliminary chamber hermetically sealed in this manner.

The substrate processing apparatus adjusts the degree of vacuum in the vacuum preliminary chamber to the same level as in the vacuum processing chamber to prevent particles from blowing up due to a pressure difference between the vacuum processing chamber and the vacuum preliminary chamber when the gate valve is opened and the substrate is loaded into and unloaded from the vacuum processing chamber.

That is, since the degree of vacuum in the vacuum preliminary chamber needs to be maintained at the same level as in the vacuum processing chamber, the same level of airtightness is required for both the vacuum processing chamber and the vacuum preliminary chamber.

While airtightness is required for both the vacuum chambers, that is, the vacuum processing chamber and the vacuum preliminary chamber, there is a problem in that the above-mentioned sealing member which hermetically seals the substrate loading/unloading port of each of the vacuum processing chamber and the vacuum preliminary chamber is made of rubber such as fluororubber or perfluororubber and thus transmits oxygen in the atmosphere when the vacuum chamber is evacuated.

Even oxygen in the atmosphere transmitted through the sealing member adversely affects quality. Thus, due to the recent demand for improving the quality of substrates, preventing oxygen transmitted through the sealing member from entering the inside of the vacuum chamber is an important issue in improving the quality of substrates.

For example, Japanese Patent No. 5806827 describes a substrate processing apparatus, including: a depressurizable hot wall chamber (vacuum processing chamber); a depressurizable transfer chamber (vacuum preliminary chamber) having a transfer arm mechanism for transferring a substrate to and from the hot wall chamber; and a gate valve unit provided between the hot wall chamber and the transfer chamber, in which the gate valve unit includes: a housing having a substrate loading/unloading port corresponding to the hot wall chamber, and a substrate loading/unloading port corresponding to the transfer chamber; and a double sealing structure having a first sealing member and a second sealing member provided at an outer side of the first sealing member, in which the first sealing member and the second sealing member are provided between a sidewall of one of the hot wall chamber and the transfer chamber, which is required to maintain a higher vacuum degree than that of the other chamber, and a sidewall of the housing, and the substrate loading/unloading port for the one chamber is surrounded by the first sealing member and the second sealing member.

In the substrate processing apparatus, the side wall of the housing is provided with at least one communicating hole which allows a gap between the sealing members to communicate with an internal space of the housing, and the substrate loading/unloading port for the one chamber sealed by the double sealing structure is opened and closed by a valve disk which is movable up and down in the housing, the substrate loading/unloading port for the one chamber sealed by the double sealing structure is closed by the valve disk, and the gap between the sealing members is evacuated by the other chamber through the communicating hole by depressurizing the other chamber with the substrate loading/unloading port for the other chamber remains open.

BRIEF SUMMARY OF THE INVENTION

However, in the substrate processing apparatus described in Japanese Patent No. 5806827, when the chamber (the vacuum processing chamber or the vacuum preliminary chamber) is evacuated, oxygen in the atmosphere transmitted through the outer sealing member passes through the inside of the housing of the gate valve unit and the inside of the other chamber through the communicating hole and is discharged from an exhaust system of the other chamber, and the oxygen thus enters the inside of the housing of the gate valve unit and the inside of the other chamber. As a result, the oxygen may enter both the chambers connected through the gate valve, which may adversely affect substrates requiring high quality.

Also, when oxygen in the atmosphere transmitted through the outer sealing member is discharged using the exhaust system of the other chamber, the inside of the housing of the gate valve unit is also evacuated, which facilitates drawing atmospheric air into the housing from the outside. When oxygen in the atmosphere enters the inside of the housing through a movable part or the like of the gate valve unit, the oxygen may enter the inside of the chamber from the housing and adversely affect substrates requiring high quality.

Thus, the chamber may not be able to maintain the airtightness required for processing high-quality substrates. In particular, it is essential to reduce the entry of oxygen transmitted through the sealing member such as rubber.

The present invention has been developed to solve the conventional problems, and an object thereof is to provide a gate valve, a substrate processing apparatus, and a substrate processing method which can improve the airtightness of a vacuum processing chamber and a vacuum preliminary chamber and also reduce the entry of oxygen transmitted through a sealing member into the vacuum processing chamber and the vacuum preliminary chamber from the atmosphere while maintaining compactness.

To achieve the above-mentioned object, the invention according to a first aspect is a gate valve having a face facing a depressurizable vacuum processing chamber and a face facing a depressurizable vacuum preliminary chamber, the faces abutting on annular sealing members surrounding entire circumferences of substrate loading/unloading ports of the vacuum processing chamber and the vacuum preliminary chamber, the substrate loading/unloading ports being disposed facing each other, the gate valve openably and closably connecting the vacuum processing chamber and the vacuum preliminary chamber, the gate valve including: sealing channels provided between the sealing members doubly provided outside and inside surrounding the entire circumference of the substrate loading/unloading port of at least one of the vacuum processing chamber or the vacuum preliminary chamber and between other sealing members doubly provided outside and inside in one or more parts inside the gate valve; and a gas circulation channel including a plurality of the sealing channels and being configured to guide inert gas such as nitrogen gas so that the inert gas continuously flows from an inlet to an outlet for the inert gas.

The invention according to a second aspect is the gate valve, in which the gas circulation channel is a single continuous channel from the inlet to the outlet.

The invention according to a third aspect is the gate valve, in which the sealing channel between the sealing members doubly provided outside and inside on the vacuum preliminary chamber has a gas feeding-out port through which inert gas is fed out to a sealing part inside the vacuum preliminary chamber, and a gas receiving port through which the inert gas returned from the sealing part inside the vacuum preliminary chamber is received.

To achieve the above-mentioned object, the invention according to a fourth aspect is a substrate processing apparatus including: a depressurizable vacuum processing chamber; a depressurizable vacuum preliminary chamber having a substrate loading/unloading port disposed facing a substrate loading/unloading port of the vacuum processing chamber; and a gate valve having a face facing the vacuum processing chamber and a face facing the vacuum preliminary chamber, each of the faces abutting on annular sealing members surrounding an entire circumference of each of the substrate loading/unloading ports of the vacuum processing chamber and the vacuum preliminary chamber, the sealing members being doubly provided outside and inside in at least one of the vacuum processing chamber or the vacuum preliminary chamber, the gate valve openably and closably connecting the vacuum processing chamber and the vacuum preliminary chamber, in which the gate valve includes sealing channels between the sealing members doubly provided outside and inside in at least one of the vacuum processing chamber or the vacuum preliminary chamber and between other sealing members doubly provided outside and inside in one or more parts inside the gate valve, and a gas circulation channel including a plurality of the sealing channels and being configured to guide inert gas such as nitrogen gas so that the inert gas continuously flows from an inlet to an outlet for the inert gas.

To achieve the above-mentioned object, the invention according to a fifth aspect is a substrate processing method including: processing a substrate in a depressurizable vacuum processing chamber by loading and unloading the substrate into and from the vacuum processing chamber through a depressurizable vacuum preliminary chamber having a substrate loading/unloading port disposed facing a substrate loading/unloading port of the vacuum processing chamber, the vacuum processing chamber and the vacuum preliminary chamber being openably and closably connected by a gate valve, the gate valve having a face facing the vacuum processing chamber and a face facing the vacuum preliminary chamber, the faces abutting on annular sealing members surrounding entire circumferences of the substrate loading/unloading ports of the vacuum processing chamber and the vacuum preliminary chamber, the substrate loading/unloading ports being disposed facing each other; and depressurizing the vacuum processing chamber or the vacuum preliminary chamber in a state in which inert gas flows through a gas circulation channel, the gas circulation channel including sealing channels between the sealing members doubly provided outside and inside in at least one of the vacuum processing chamber or the vacuum preliminary chamber, the vacuum processing chamber and the vacuum preliminary chamber being connected to each other by the gate valve, and between other sealing members doubly provided outside and inside in one or more parts inside the gate valve and being configured to guide inert gas such as nitrogen gas so that the inert gas continuously flows from an inlet to an outlet for the inert gas, or in a state in which the gas circulation channel is evacuated.

The invention according to the first aspect includes the sealing channels provided between the sealing members doubly provided outside and inside surrounding the entire circumference of the substrate loading/unloading port of at least one of the vacuum processing chamber or the vacuum preliminary chamber and between other sealing members doubly provided outside and inside in one or more parts inside the gate valve, and includes the gas circulation channel including the plurality of sealing channels and being configured to guide the inert gas so that the inert gas continuously flows from the inlet to the outlet for the inert gas.

Accordingly, when the vacuum processing chamber or the vacuum preliminary chamber provided with the double sealing members is depressurized, the inert gas such as nitrogen gas flowing in the sealing channel between the outer sealing member and the inner sealing member prevents oxygen in the atmosphere transmitted through the outer sealing member from being transmitted to the inner sealing member. Thus, it is possible to prevent the oxygen transmitted through the outer sealing member from entering the vacuum processing chamber or the vacuum preliminary chamber.

Also, inside the gate valve, the inert gas flowing in the sealing channel between the other sealing members prevents oxygen in the atmosphere from entering the inside of the gate valve. Thus, it is possible to prevent the oxygen from entering the vacuum processing chamber or the vacuum preliminary chamber through the inside of the gate valve.

Furthermore, oxygen in the atmosphere transmitted through the outer sealing member is taken into the flow of the inert gas in the sealing channel and discharged through the outlet of the gas circulation channel. This eliminates the necessity of using an exhaust system of one of the vacuum processing chamber or the vacuum preliminary chamber connected to the other of the vacuum processing chamber or the vacuum preliminary chamber to be depressurized through the gate valve for discharging oxygen in the atmosphere, which prevents oxygen from entering the vacuum processing chamber or the vacuum preliminary chamber through the exhaust system. As a result, it is possible to prevent the oxygen from entering the vacuum processing chamber or the vacuum preliminary chamber connected through the gate valve.

The inert gas is evenly spread across the plurality of sealing channels from the inlet to the outlet, which eliminates the necessity of providing a gas circulation channel having an inlet and an outlet in each of the sealing channels.

Thus, it is possible to improve the airtightness of the vacuum processing chamber and the vacuum preliminary chamber. In addition, it is possible to reduce oxygen entering the inside of the vacuum processing chamber and the vacuum preliminary chamber through the sealing members from the atmosphere while maintaining compactness.

According to the invention according to the second aspect, the gas circulation channel is a single continuous channel from the inlet to the outlet. Thus, the occurrence of pressure loss of the inert gas caused by branching, merging, or the like of the gas circulation channel is prevented, and the inert gas flows through the plurality of sealing channels at a steady flow rate and velocity. Thus, it is possible to stably take in oxygen transmitted through the outer sealing member and discharge the oxygen through the outlet. As a result, it is possible to more effectively reduce oxygen entering the inside of the chamber through the sealing members from the atmosphere.

According to the invention according to the third aspect, the sealing channel between the sealing members doubly provided outside and inside on the vacuum preliminary chamber has the gas feeding-out port through which inert gas is fed out to the sealing part inside the vacuum preliminary chamber, and the gas receiving port through which the inert gas returned from the sealing part inside the vacuum preliminary chamber is received. This makes it possible to extend the gas circulation channel provided in the gate valve, the gas circulation channel being continuous from the inlet to the outlet, to the sealing part inside the vacuum preliminary chamber. Thus, it is also possible to increase the airtightness inside the vacuum preliminary chamber with a simple and compact configuration.

The invention according to the fourth aspect includes the gate valve openably and closably connecting the vacuum processing chamber and the vacuum preliminary chamber. The gate valve includes the sealing channels between the sealing members doubly provided outside and inside in at least one of the vacuum processing chamber or the vacuum preliminary chamber and between other sealing members doubly provided outside and inside in one or more parts inside the gate valve, and the gas circulation channel including the plurality of sealing channels and being configured to guide inert gas so that the inert gas continuously flows from the inlet to the outlet for the inert gas.

Accordingly, when the vacuum processing chamber or the vacuum preliminary chamber provided with the double sealing members is depressurized, the inert gas such as nitrogen gas flowing in the sealing channel between the outer sealing member and the inner sealing member prevents oxygen in the atmosphere transmitted through the outer sealing member from being transmitted to the inner sealing member. Thus, it is possible to prevent the oxygen transmitted through the outer sealing member from entering the vacuum processing chamber or the vacuum preliminary chamber.

Also, inside the gate valve, the inert gas flowing in the sealing channel between the other sealing members prevents oxygen in the atmosphere from entering the inside of the gate valve. Thus, it is possible to prevent the oxygen from entering the vacuum processing chamber or the vacuum preliminary chamber through the inside of the gate valve.

Furthermore, oxygen in the atmosphere transmitted through the outer sealing member is taken into the flow of the inert gas in the sealing channel and discharged through the outlet of the gas circulation channel. This eliminates the necessity of using an exhaust system of one of the vacuum processing chamber or the vacuum preliminary chamber connected to the other of the vacuum processing chamber or the vacuum preliminary chamber to be depressurized through the gate valve for discharging oxygen in the atmosphere, which prevents oxygen from entering the vacuum processing chamber or the vacuum preliminary chamber through the exhaust system. As a result, it is possible to prevent the oxygen from entering the vacuum processing chamber or the vacuum preliminary chamber connected through the gate valve.

The inert gas is evenly spread across the plurality of sealing channels from the inlet to the outlet, which eliminates the necessity of providing a gas circulation channel having an inlet and an outlet in each of the sealing channels.

Thus, it is possible to improve the airtightness of the vacuum processing chamber and the vacuum preliminary chamber. In addition, it is possible to reduce oxygen entering the inside of the vacuum processing chamber and the vacuum preliminary chamber through the sealing members from the atmosphere while maintaining compactness.

The invention according to the fifth aspect depressurizes the vacuum processing chamber or the vacuum preliminary chamber in a state in which inert gas flows through the gas circulation channel, the gas circulation channel including the sealing channels between the sealing members doubly provided outside and inside in at least one of the vacuum processing chamber or the vacuum preliminary chamber, the vacuum processing chamber and the vacuum preliminary chamber being connected to each other by the gate valve, and between the other sealing members doubly provided outside and inside in one or more parts inside the gate valve and being configured to guide the inert gas so that the inert gas continuously flows from the inlet to the outlet, or in a state in which the gas circulation channel is evacuated.

Accordingly, when the vacuum processing chamber or the vacuum preliminary chamber provided with the double sealing members is depressurized, the inert gas such as nitrogen gas flowing in the sealing channel between the outer sealing member and the inner sealing member prevents oxygen in the atmosphere transmitted through the outer sealing member from being transmitted to the inner sealing member. Thus, it is possible to prevent the oxygen transmitted through the outer sealing member from entering the vacuum processing chamber or the vacuum preliminary chamber.

Also, inside the gate valve, the inert gas flowing in the sealing channel between the other sealing members prevents oxygen in the atmosphere from entering the inside of the gate valve. Thus, it is possible to prevent the oxygen from entering the vacuum processing chamber or the vacuum preliminary chamber through the inside of the gate valve.

Furthermore, oxygen in the atmosphere transmitted through the outer sealing member is taken into the flow of the inert gas in the sealing channel and discharged through the outlet of the gas circulation channel. This eliminates the necessity of using an exhaust system of one of the vacuum processing chamber or the vacuum preliminary chamber connected to the other of the vacuum processing chamber or the vacuum preliminary chamber to be depressurized through the gate valve for discharging oxygen in the atmosphere, which prevents oxygen in the atmosphere from entering the vacuum processing chamber or the vacuum preliminary chamber through the exhaust system. As a result, it is possible to prevent the oxygen from entering the vacuum processing chamber or the vacuum preliminary chamber connected through the gate valve.

The inert gas is evenly spread across the plurality of sealing channels from the inlet to the outlet, which eliminates the necessity of providing a gas circulation channel having an inlet and an outlet in each of the sealing channels.

Thus, it is possible to improve the airtightness of the vacuum processing chamber and the vacuum preliminary chamber. In addition, it is possible to reduce oxygen entering the inside of the vacuum processing chamber and the vacuum preliminary chamber through the sealing members from the atmosphere while maintaining compactness.

BRIEF DESCRIPTION OF THE DRAWINGS

FIGS. 3A and 3B are diagrams of the gate valve illustrated in FIG. 1 in which FIG. 3A is a diagram viewed from a face facing the process chamber, and FIG. 3B is a diagram viewed from a face facing the transfer chamber.

DETAILED DESCRIPTION OF THE INVENTION

An embodiment of a gate valve, a substrate processing apparatus, and a substrate processing method according to the present invention will be described in detail with reference to FIGS. 1 to 9.

Note that the present disclosure is not limited to the embodiment described below. Further, it should be noted that the drawings are schematic and the relationship between the dimensions of the elements and the proportion of each element may differ from actual ones. In addition, between the drawings, parts that differ in the relationship in dimension and proportions from each other may be included.

Figure 1:
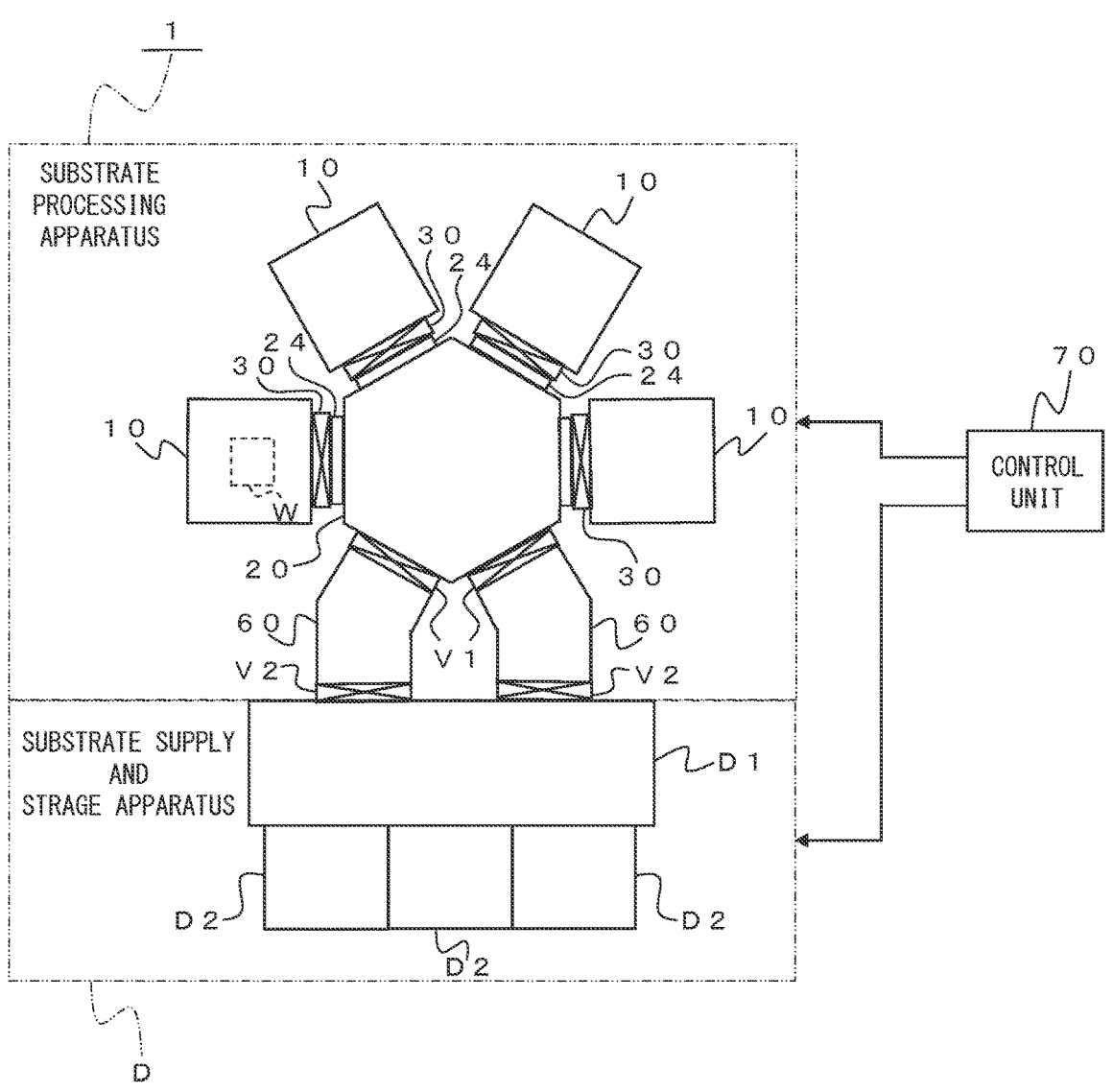
FIG. 1 is a diagram illustrating schematic configurations of a gate valve and a substrate processing apparatus with the gate valve incorporated therein according to an embodiment.
Figure 2:
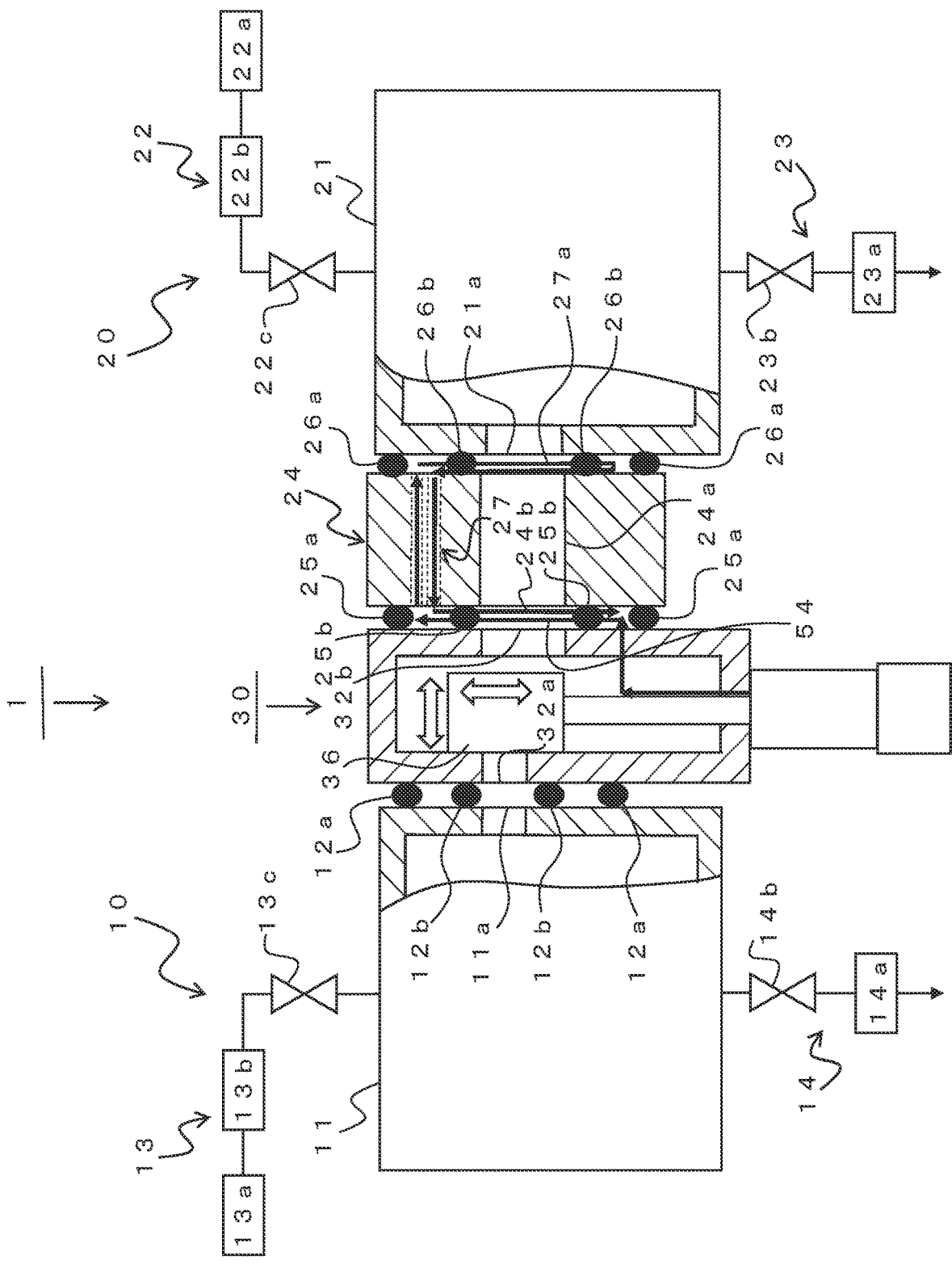
FIG. 2 is a diagram for describing, in more detail, configurations of the gate valve, a process chamber, and a transfer chamber of the substrate processing apparatus illustrated in FIG. 1.
Figure 3:
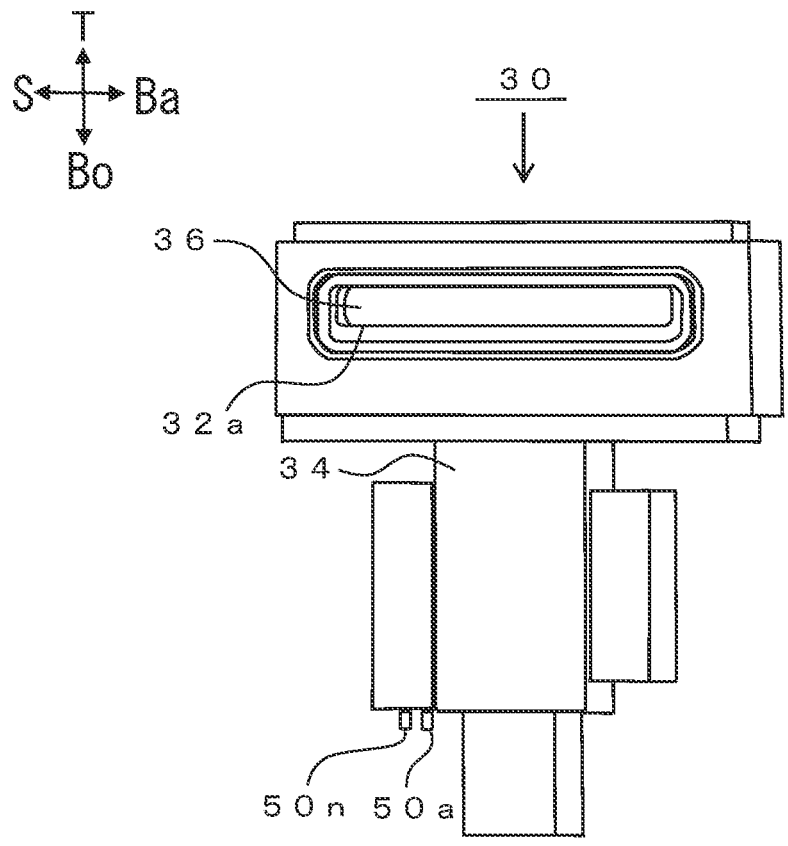
Figure 3B:
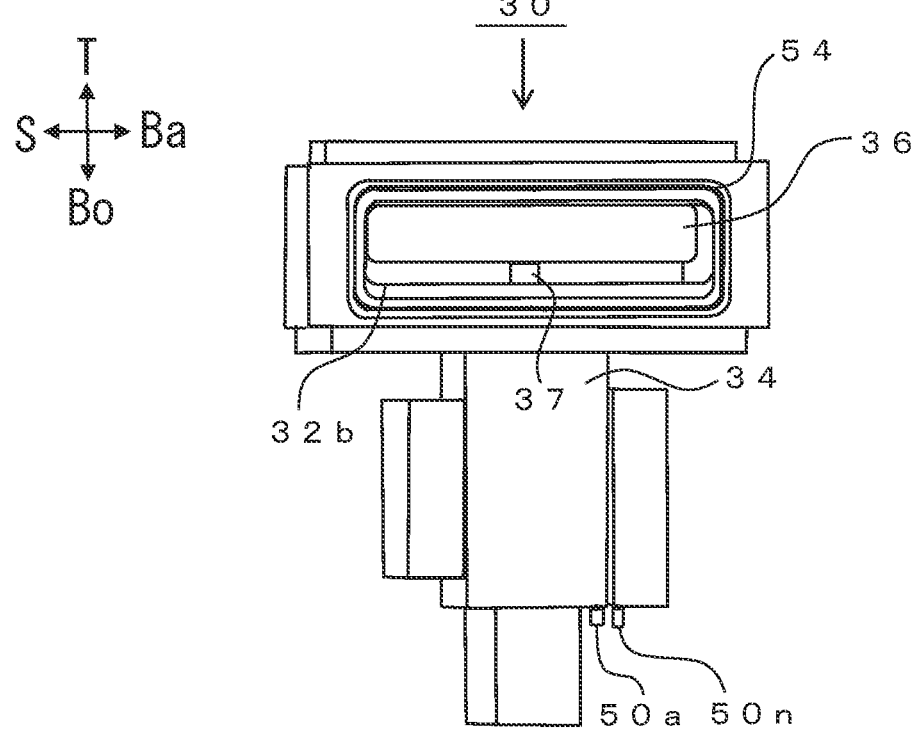
Figure 4:
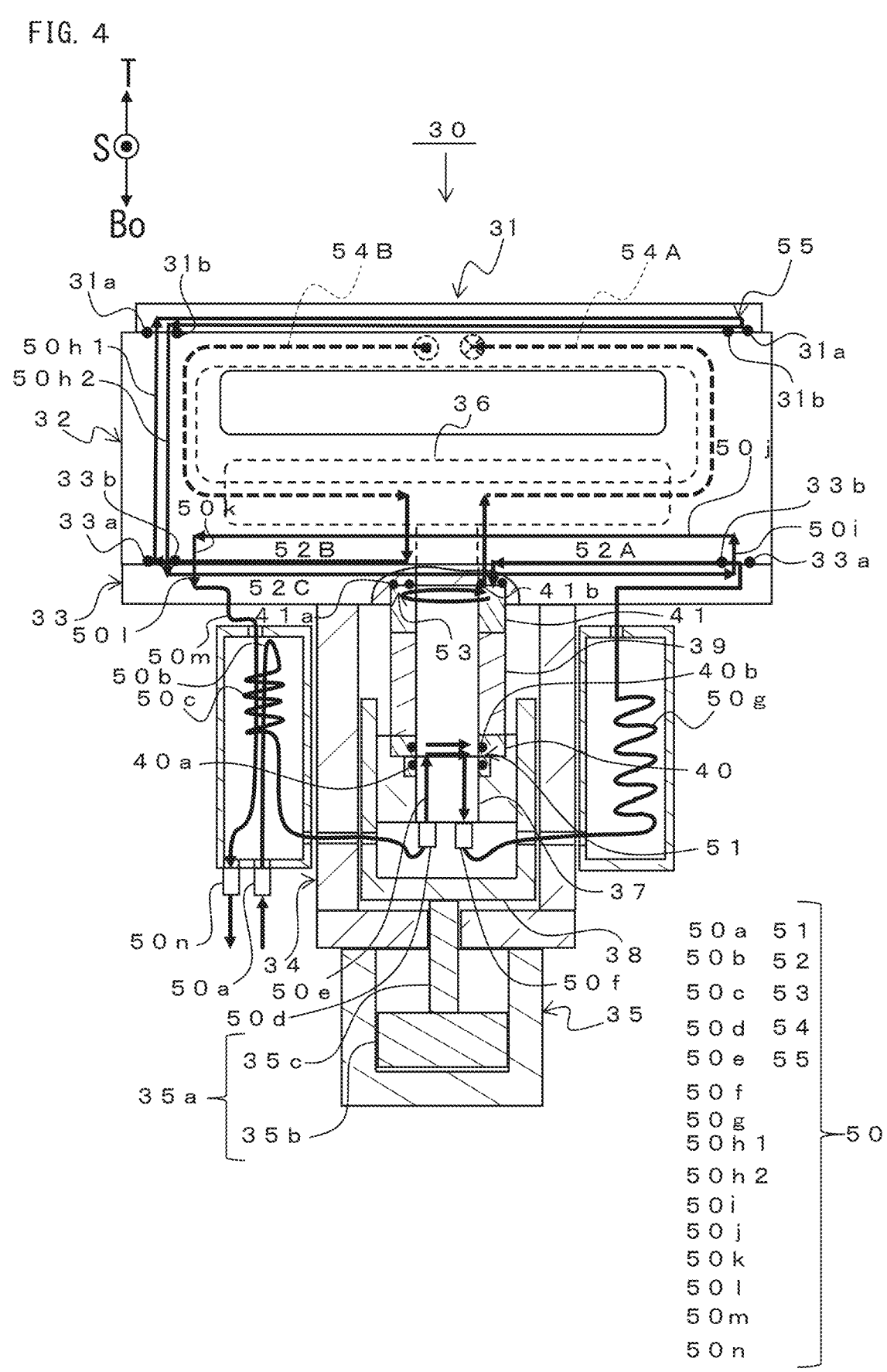
FIG. 4 is a diagram for describing the configuration of the gate valve in more detail.
Figure 5:
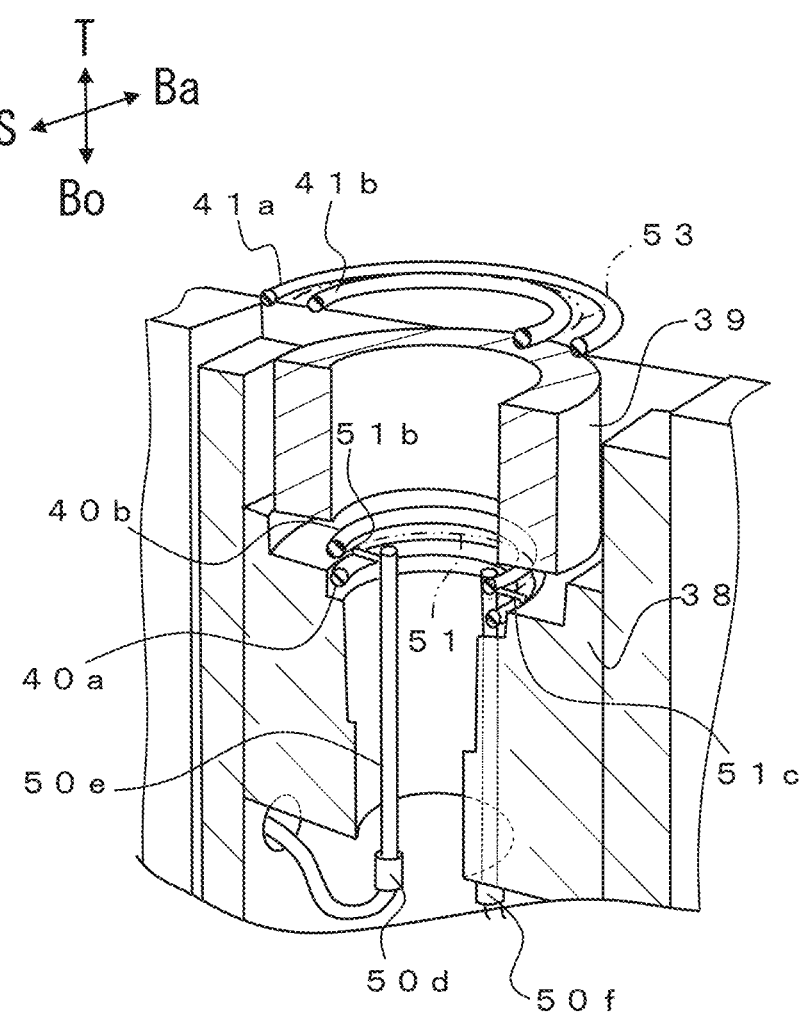
FIG. 5A is a perspective sectional view of a first sealing channel and a third sealing channel of the gate valve and the surroundings thereof.
FIG. 5B is a front sectional view of the first sealing channel and the third sealing channel of the gate valve and the surroundings thereof.
Figure 5B:
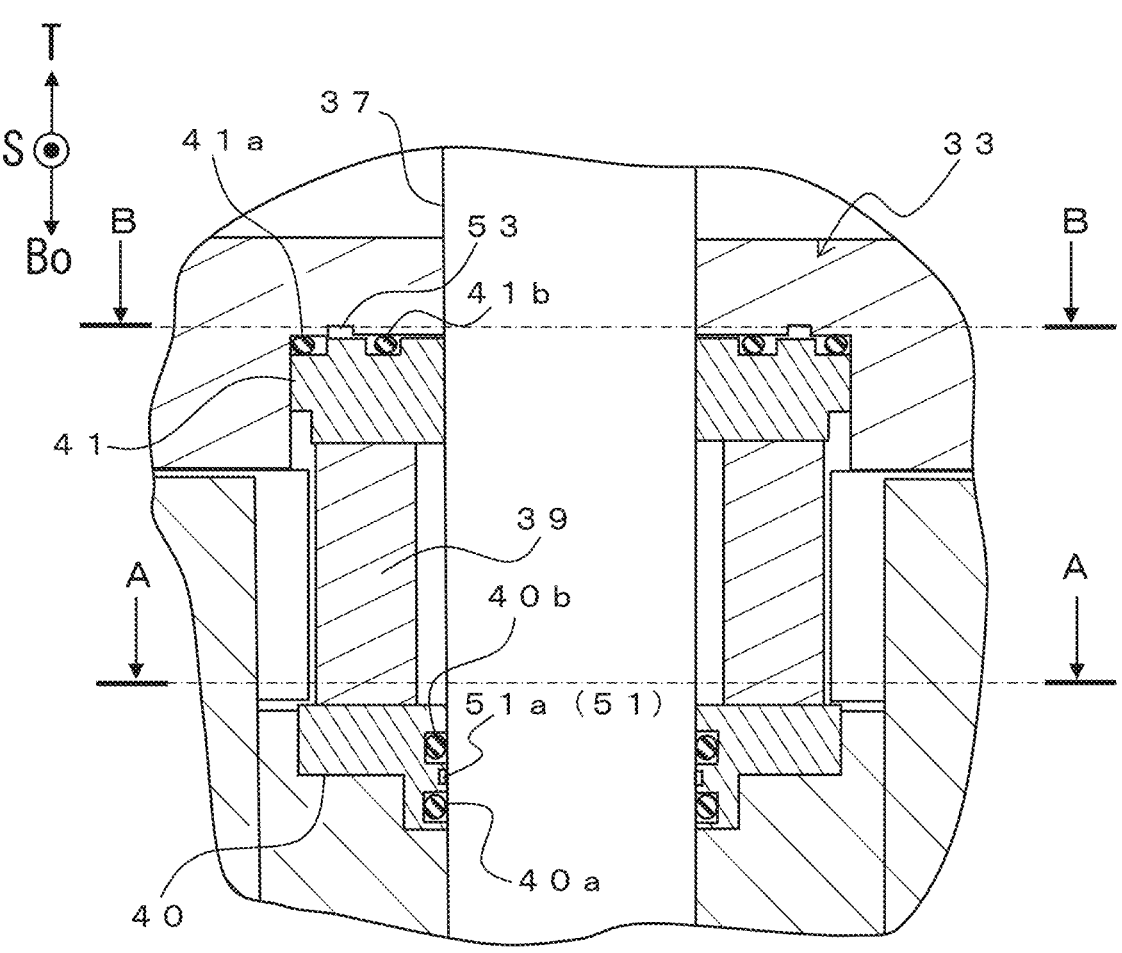
Figure 6:
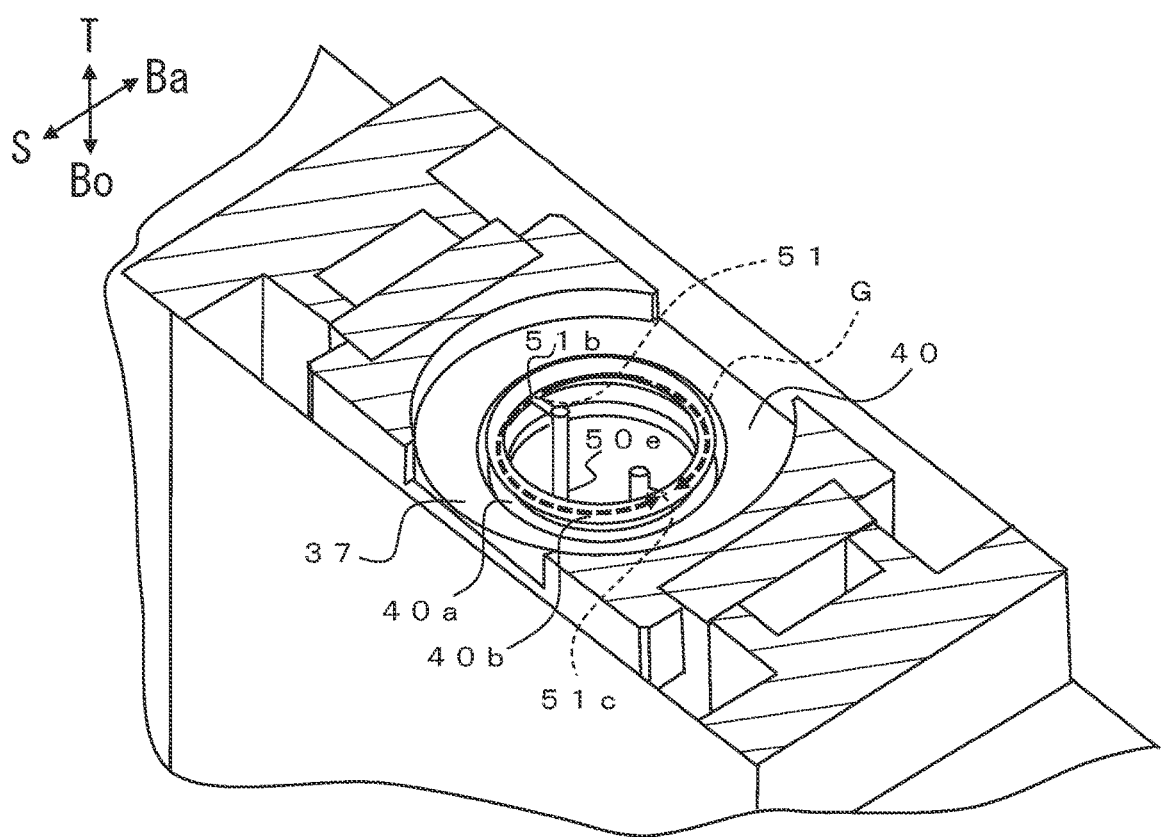
FIG. 6A is a sectional view of the gate valve taken along line A-A in FIG. 5B.
FIG. 6B is a sectional view of the gate valve taken along line B-B in FIG. 5B.
Figure 6:
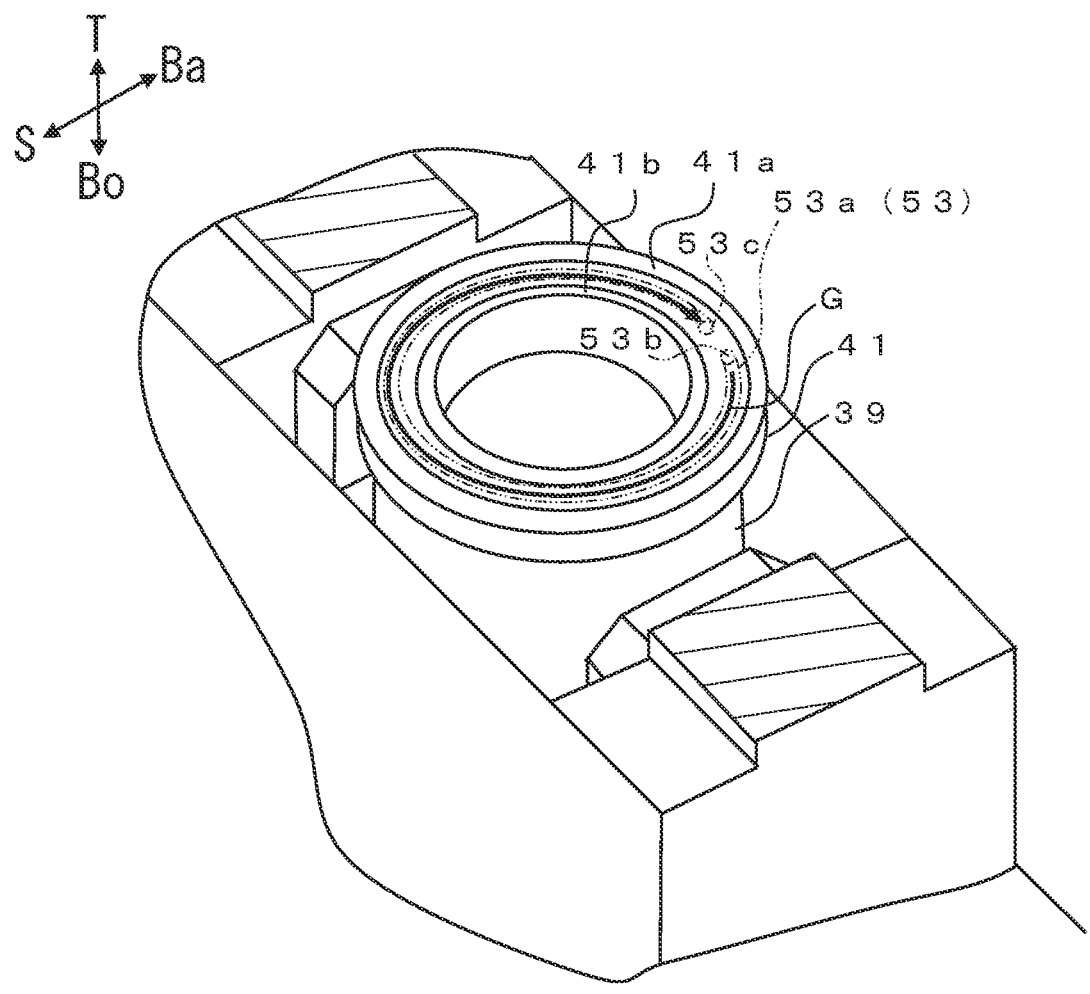
Figure 7:
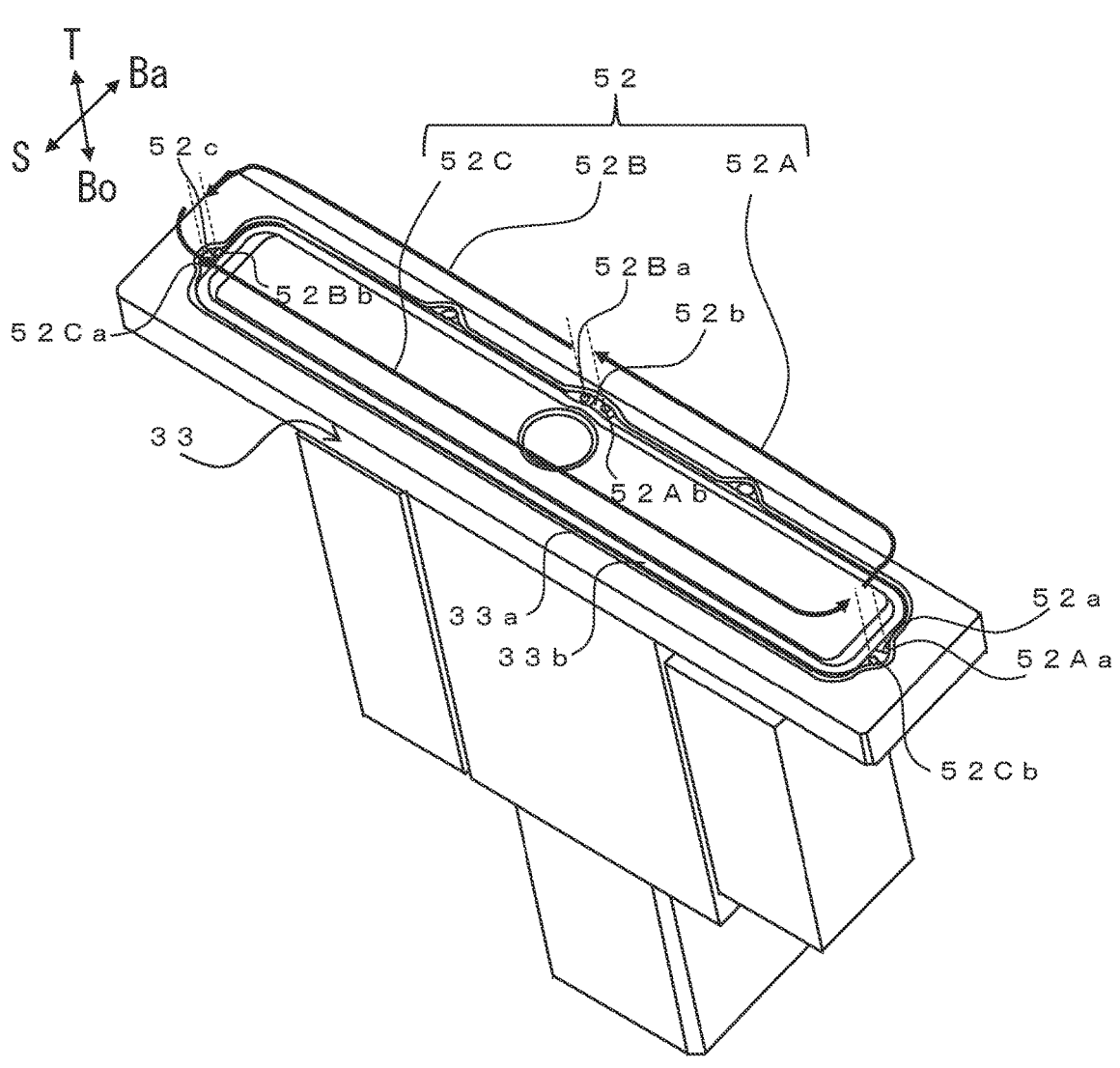
FIG. 7 is a sectional view of the gate valve at a position corresponding to a front face of a bonnet.
Figure 8:
FIG. 8 is a diagram illustrating a substrate loading/unloading port and the surroundings thereof on the face of the gate valve facing the transfer chamber.
Figure 8:
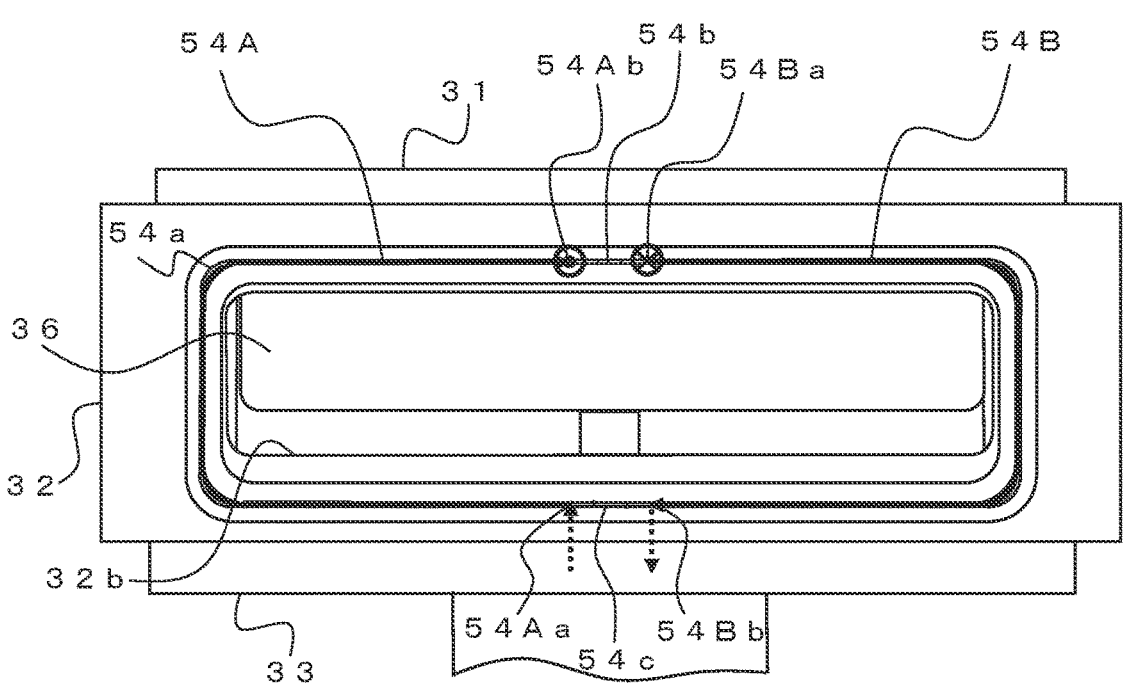
Figure 9:
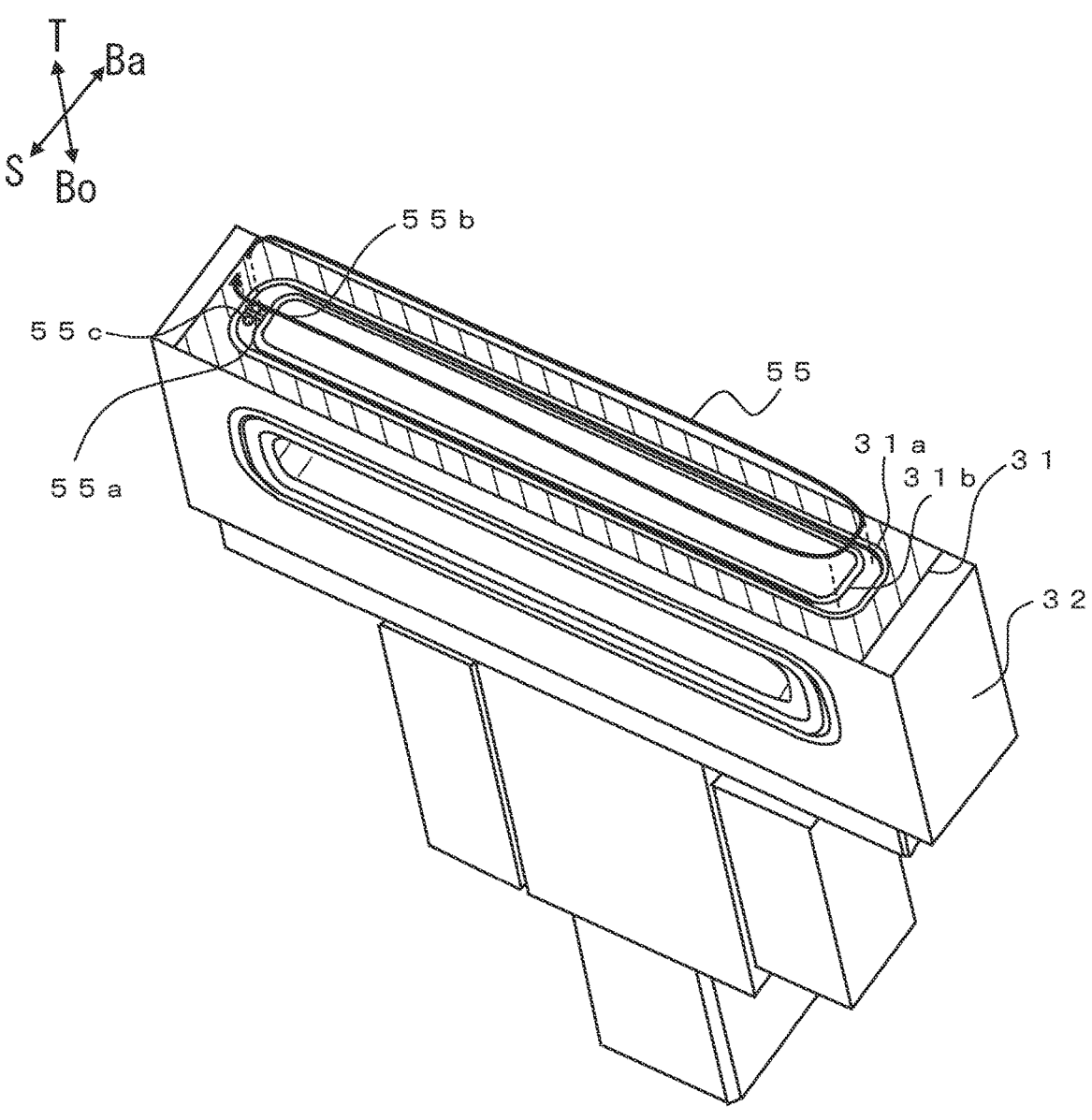
FIG. 9 is a sectional view of the gate valve at a position slightly above a bottom face of a body cover.

FIG. 1 is a diagram illustrating schematic configurations of a gate valve 30 and a substrate processing apparatus 1 with the gate valve 30 incorporated therein according to the embodiment of the present invention. FIG. 2 is a diagram for describing, in more detail, configurations of the gate valve 30, a process chamber 10, and a transfer chamber 20 of the substrate processing apparatus 1 illustrated in FIG. 1. FIGS. 3A and 3B are diagrams of the gate valve 30 illustrated in FIG. 1 in which FIG. 3A is a diagram viewed from a face facing the process chamber 10, and FIG. 3B is a perspective view viewed from a face facing the transfer chamber 20. FIG. 4 is a diagram for describing the configuration of the gate valve 30 in more detail. FIG. 5A is a perspective sectional view of a first sealing channel 51 and a third sealing channel 53 of the gate valve 30 and the surroundings thereof, and FIG. 5B is a front sectional view of the first sealing channel 51 and the third sealing channel 53 of the gate valve 30 and the surroundings thereof. FIG. 6A is a sectional view of the gate valve 30 taken along line A-A in FIG. 5B, and FIG. 6B is a sectional view of the gate valve 30 taken along line B-B in FIG. 5B. FIG. 7 is a sectional view of the gate valve 30 at a position corresponding to a front face of a bonnet 33. FIG. 8 is a diagram illustrating a substrate loading/unloading port 32 and the surroundings thereof on the face of the gate valve 30 facing the transfer chamber 20. FIG. 9 is a sectional view of the gate valve 30 at a position slightly above a bottom face of a body cover 31.

Note that FIG. 1 also illustrates a substrate supply and storage apparatus D in addition to the substrate processing apparatus 1 to describe the entire process including loading of a substrate.

Also, in FIGS. 3 to 9, the directions of three axes perpendicular to each other are defined as a front direction (S), a back direction (Ba), a top direction (T), and a bottom direction (Bo) to make the description clearer.

Also, in FIG. 6B, the bonnet 33 is omitted, and only a groove 53a, a sealing channel inlet 53b, and a sealing channel outlet 53c which are formed on a back face of the bonnet 33 are shown by virtual lines to make the description clearer.

The substrate processing apparatus 1 according to the embodiment of the present invention is connected to the substrate supply and storage apparatus D in the atmospheric atmosphere through a load lock chamber 60 and configured to perform a process such as a deposition process or an etching process on a semiconductor wafer W which is a substrate supplied from the substrate supply and storage apparatus D, and return the processed semiconductor wafer W to the substrate supply and storage apparatus D and store the semiconductor wafer W therein.

That is, the substrate processing apparatus 1 and the substrate supply and storage apparatus D constitute a substrate processing system which performs a series of semiconductor manufacturing processes including the supply of the semiconductor wafer W, the processing of the semiconductor wafer W. and the storage of the processed semiconductor wafer W.

Hereinbelow, the substrate processing apparatus 1 according to the embodiment of the present invention will be described together with the substrate supply and storage apparatus D which constitutes a part of the substrate processing system.

<Entire Configuration of Substrate Processing Apparatus 1>

The substrate processing apparatus 1 includes four depressurizable process chambers 10 each of which serves as a vacuum processing chamber, one depressurizable transfer chamber 20 which serves as a vacuum preliminary chamber, the gate valve 30 which openably and closably connects each of the process chambers 10 and the transfer chamber 20, two load lock chambers 60 each of which is a chamber for connecting a loader chamber D1 of the substrate supply and storage apparatus D and the transfer chamber 20, and a control unit 70 which controls the operation of each part of the substrate processing apparatus 1.

Note that the number of process chambers 10 is not limited to four and may be another number.

<Process Chamber 10>

Each of the process chambers 10 is configured in such a manner that the inside thereof can be depressurized to a predetermined vacuum pressure and gas can be introduced thereinto.

The process chamber 10 is, for example, made of metal containing aluminum (Al), yttrium (Y), or the like and has a box shape. The processor chamber 10 includes a chamber body 11 having a substrate loading/unloading port 11a through which the semiconductor wafer W is loaded and unloaded, a gas introduction system 13 for introducing gas required for processing the semiconductor wafer W into the inside of the chamber body 11, and an exhaust system 14 for discharging gas inside the chamber body 11.

The process chamber 10 is provided with annular sealing members 12a, 12b surrounding the entire circumference of the substrate loading/unloading port 11a, the sealing members 12a, 12b being doubly provided outside and inside.

The sealing members 12a, 12b are made of, for example, rubber such as fluororubber or perfluororubber. Note that the sealing members 12a, 12b are not limited to fluororubber or perfluororubber, and other rubber may be used.

The gas introduction system 13 includes a gas supply source 13a, a mass flow controller (MFC) 13b, and a gas introduction valve 13c, and is connected to the chamber body 11.

Examples of the gas introduced by the gas introduction system 13 into the process chamber 10 include, in the case of Ru film deposition, gas obtained by heating and vaporizing an Ru complex (e.g., $Ru_3 (CO)_{12}$:ruthenium carbonyl) which is solid at room temperature, carrier gas (e.g., CO gas) used to vaporize this, and diluent gas (e.g., Ar gas and $N_2$ gas).

The exhaust system 14 includes a vacuum pump 14a and a pressure adjusting valve 14b, and is connected to the chamber body 11.

The vacuum pump 14a includes, for example, a main pump such as a turbo-molecular pump, and an auxiliary pump connected to the exhaust side of the main pump. After the auxiliary pump performs rough pumping to a predetermined degree of vacuum, the main pump performs main pumping to a higher degree of vacuum.

For example, an auto pressure controller (APC) valve is used as the pressure adjusting valve 14b.

<Transfer Chamber 20>

The transfer chamber 20 is configured in such a manner that the inside thereof can be depressurized to a predetermined vacuum pressure and a gas can be introduced thereinto.

The transfer chamber 20 is made of, for example, metal containing aluminum (Al), yttrium (Y), or the like and has a box shape. The transfer chamber 20 includes a chamber body 21 having, on one side face, a substrate loading/unloading port 21a through which the semiconductor wafer W is loaded and unloaded, a gas introduction system 22 for introducing gas required for processing the semiconductor wafer W into the inside of the chamber body 21, and an exhaust system 23 for discharging gas inside the chamber body 21.

In the present embodiment, the transfer chamber 20 is provided with a heat insulating connection part 24 which connects the chamber body 21 and the gate valve 30 with heat insulation.

The heat insulating connection part 24 is configured, for example, using a urethane material and an aluminum plate and provided facing the one side face of the chamber body 21 where the substrate loading/unloading port 21a is formed.

The heat insulating connection part 24 is provided with a substrate loading/unloading passage 24a communicating with the substrate loading/unloading port 21a of the chamber body 21. An end opening of the substrate loading/unloading passage 24a at the side facing the gate valve 30 serves as a substrate loading/unloading port 24b of the transfer chamber 20.

The heat insulating connection part 24 is provided with annular sealing members 25a and 25b surrounding the entire circumference of the substrate loading/unloading port 24b and the sealing members 25a and 25b being doubly provided outside and inside.

Note that, in the present embodiment, in "outside and inside" in being doubly provided outside and inside, a position that is inside when viewed in an entering direction of oxygen in the atmosphere is defined as "inside", and a position that is outside when viewed in the entering direction of oxygen in the atmosphere is defined as "outside".

The sealing members 25a and 25b are made of, for example, rubber such as fluororubber or perfluororubber. Note that the sealing members 25a and 25b are not limited to fluororubber or perfluororubber, and other rubber may be used.

The heat insulating connection part 24 is also provided with, on a face facing the chamber body 21 of the transfer chamber 20, annular sealing members 26a and 26b surrounding the entire circumference of the end opening of the substrate loading/unloading passage 24a, the sealing members 26a and 26b being doubly provided outside and inside.

The gas introduction system 22 includes a gas supply source 22a, a mass flow controller (MFC) 22b, and a gas introduction valve 22c, and is connected to the transfer chamber 20.

Examples of the gas introduced by the gas introduction system 22 into the transfer chamber 20 include inert gas used as purge gas or pressure adjusting gas, such as Ar gas, Ne gas, He gas, and $N_2$ gas.

The exhaust system 23 includes a vacuum pump 23a and a pressure adjusting valve 23b, and is connected to the transfer chamber 20.

The vacuum pump 23a includes, for example, a main pump such as a turbo-molecular pump, and an auxiliary pump connected to the exhaust side of the main pump.

After the auxiliary pump performs rough pumping to a predetermined degree of vacuum, the main pump performs main pumping to a higher degree of vacuum.

Inside the transfer chamber 20, a transfer chamber side transferring mechanism (not illustrated) which transfers the semiconductor wafer W is provided. The transfer chamber side transferring mechanism loads and unloads the semiconductor wafer W into and from each of the load lock chambers 60 and each of the process chambers 10.

<Substrate Supply and Storage Apparatus D>

The substrate supply and storage apparatus D constituting a part of the substrate processing system includes the loader chamber D1.

A plurality of substrate housing parts D2 composed of a cassette container capable of housing a plurality of semiconductor wafers W are adjacent to the loader chamber D1.

Inside the loader chamber D1, a loader chamber side transferring mechanism (not illustrated) which transfers the semiconductor wafer W is provided. The loader chamber side transferring mechanism loads and unloads the semiconductor wafer W into and from each of the load lock chambers 60 and each of the substrate housing parts D2.

<Gate Valve 30>

The gate valve 30 has a face facing the depressurizable process chamber 10 and a face facing the depressurizable transfer chamber 20, the faces abutting on the annular sealing members 12a, 12b, 25a and 25b surrounding the entire circumferences of the substrate loading/unloading ports 11a and 24b of the process chamber 10 and the transfer chamber 20, the substrate loading/unloading ports 11a and 24b being disposed facing each other, and openably and closably connects the process chamber 10 and the transfer chamber 20.

The gate valve 30 includes the body cover 31, a body 32, the bonnet 33, a valve body 34, and an actuator 35 which are assembled in this order from top to bottom.

The body cover 31 has a plate shape and closes an upper opening of the body 32.

As illustrated in FIGS. 4 and 9, annular sealing members 31a and 31b (hereinbelow, referred to as "other sealing members" to be distinguished from the sealing members 25a and 25b of the transfer chamber 20) are doubly provided outside and inside on a back face of the body cover 31, the back face abutting on an upper face of the body 32. The body cover 31 is fixed to the body 32 while hermetically sealing the upper opening of the body 32 through the other outer and inner double sealing members 31a and 31b.

The sealing members 31a, 31b are made of, for example, rubber such as fluororubber or perfluororubber. Note that the sealing members 31a and 31b are not limited to fluororubber or perfluororubber, and other rubber may be used.

The body 32 has a box shape with upper and lower openings, and the body cover 31 is assembled to the upper opening, and the bonnet 33 is assembled to the lower opening.

Substrate loading/unloading ports 32a and 32b are respectively formed in front and back faces of the body 32, that is, in a face facing the process chamber 10 and a face facing the transfer chamber 20.

The bonnet 33 has a plate shape. As illustrated in FIGS. 4 and 7, annular sealing members 33a and 33b (hereinbelow, referred to as "other sealing members" to be distinguished from the sealing members 25a and 25b of the transfer chamber 20) are doubly provided outside and inside on a front face of the bonnet 33 at the side abutting on the lower face of the body 32. The bonnet 33 is fixed to the body 32 while hermetically sealing the lower opening of the body 32 through the other outer and inner double sealing members 32a and 32b.

The sealing members 33a and 33b are made of, for example, rubber such as fluororubber or perfluororubber. Note that the sealing members 33a and 33b are not limited to fluororubber or perfluororubber, and other rubber may be used.

A stem 37 provided with a valve disk 36 on its upper end is provided inside the valve body 34 with its upper end projecting toward the body 32 through an insertion hole of the bonnet 33.

The stem 37 is supported by a stem guide 38 which is provided inside the valve body 34 movably up and down.

A bellows 39 is provided inside the valve body 34 to hermetically seal the insertion hole of the bonnet 33 through which the stem 37 is inserted.

The bellow 39 has a lower end fixed to the stem 37 through a bellows ring 40 and an upper end fixed to the bonnet 33 through a bellows flange 41.

As illustrated in FIG. 5B, other sealing members 40a and 40b are doubly provided outside and inside on an inner circumferential face of the bellows ring 40 to hermetically seal a gap between the inner circumferential face of the bellows ring 40 and an outer circumferential face of the stem 37.

Note that, as described above, in the present embodiment, in "outside and inside" in being doubly provided outside and inside, the position that is inside when viewed in the entering direction of oxygen in the atmosphere is defined as "inside", and the position that is outside when viewed in the entering direction of oxygen in the atmosphere is defined as "outside".

Thus, the other double sealing members 40a and 40b are doubly provided outside and inside abutting on the outer circumferential face of the stem 37, with the lower side corresponding to the outside when viewed in the entering direction of oxygen in the atmosphere and the upper side corresponding to the inside when viewed in the entering direction of oxygen in the atmosphere.

As illustrated in FIG. 5A, the bellows flange 41 includes sealing members 41a, 41b (hereinbelow, referred to as "other sealing members" to be distinguished from the sealing members 25*a* and 25*b* of the transfer chamber 20) which are doubly provided outside and inside abutting on the back face of the bonnet 33, with radial outside corresponding to the outside and radial inside corresponding to the inside.

The other sealing members 40*a*, 40*b*, 41*a* and 41*b* used in the bellows ring 40 and the bellows flange 41 are made of, for example, rubber such as fluororubber or perfluororubber. Note that the sealing members 40*a*. 40*b*, 41*a* and 41*b* are not limited to fluororubber or perfluororubber, and other rubber may be used.

The actuator 35 includes an elevating drive mechanism 35*a* composed of an air actuator including a piston head 35*b* and a piston rod 35*c*.

The piston rod 35*c* is coupled to the stem guide 38 through a cam mechanism or the like (not illustrated) to move the stem 37 up and down through the stem guide 38.

Note that the actuator 35 further includes a horizontal drive mechanism (not illustrated). The horizontal drive mechanism moves the valve disk 36 so that the valve disk 36 can come into contact with and separate from the substrate loading/unloading port 32*a* facing the process chamber 10.

The gate valve 30 includes a gas circulation channel 50.

The gas circulation channel 50 is provided with sealing channels 51, 52, 53, 54 and 55 between the sealing members 25*a* and 25*b* which are doubly provided outside and inside surrounding the entire circumference of the substrate loading/unloading port 24*b* of the transfer chamber 20, more specifically, the entire circumference of the substrate loading/unloading port 24*b* of the heat insulating connection part 24 and between the other annular sealing members 31*a*, 31*b*, 33*a*, 33*b*, 40*a*, 40*b*, 41*a* and 41*b* which are doubly provided outside and inside in one or more parts inside the gate valve 30.

More specifically, the gas circulation channel 50 includes the sealing channels 51 to 55 and other channels 50*a* to 50*n*, which will be described further below.

The gas circulation channel 50 includes the plurality of sealing channels 51, 52, 53, 54 and 55 and guides inert gas G so that the inert gas G continuously flows from an inlet 50*a* to an outlet 50*n* for the inert gas G.

In the present embodiment, $N_2$ (nitrogen) gas is used as the inert gas. Note that any gas that does not affect the processing of the semiconductor wafer other than $N_2$ (nitrogen) gas may be used as the inert gas. For example, Ar (argon) gas may be used.

Note that the inlet 50*a* and the outlet 50*n* are, for example, connected to each connection destination through a tube (not illustrated) using a tube coupling.

For example, the inlet 50*a* is connected to a supply source of the inert gas G through a tube, and the outlet 50*n* is connected to a collection destination of the inert gas G through a tube.

<Detailed Configuration of Gas Circulation Channel 50>

The gas circulation channel 50 is provided with the first to fifth five sealing channels 51, 52, 53, 54 and 55.

Hereinbelow, the sealing channels 51, 52, 53, 54 and 55 will be described in order from the upstream side to the downstream side from the inlet 50*a* to the outlet 50*n* for the inert gas G of the gas circulation channel 50.

First, as illustrated in FIG. 4, the inert gas G flowing into the gas circulation channel 50 through the inlet 50*a* passes through a channel composed of an entrance L-shaped pipe 50*b* which extends upward and then turns down and a channel composed of a first helical pipe 50*c* helically extending downward, then passes through a stem entrance coupling 50*d* provided on the lower end of the stem 37 and an intra-stem channel 50*e* provided inside the stem 37, and flows into the first sealing channel 51 provided in the bellows ring 40.

As illustrated in FIG. 5B, the first sealing channel 51 is a channel provided between the other outer and inner double sealing members 40*a* and 40*b* provided in the bellows ring 40.

More specifically, the first sealing channel 51 has a groove 51*a* which is annularly formed along an inner circumference of the bellows ring 40 between the other outer and inner double sealing members 40*a* and 40*b*.

The first sealing channel 51 forms a channel for the inert gas G to annularly flow along the outer circumferential face of the stem 37 by a combination of the groove 51*a* and the outer circumferential face of the stem 37 closing an opening of the groove 51*a*.

As illustrated in FIGS. 5A and 6A, the first sealing channel 51 has one sealing channel inlet 51*b* through which the inert gas G flows in from the upstream side, and one sealing channel outlet 51*c* through which the inert gas G flowing in through the sealing channel inlet 51*b* flows out to the downstream side.

Thus, the inert gas G flowing in through the sealing channel inlet 51*b* of the first sealing channel 51 is split and each flows in a semi-circular shape along the outer circumferential face of the stem 37. Then, the split flows of the inert gas G merge at the one sealing channel outlet 51*c*, and the inert gas G flows out to the downstream side.

The inert gas G flowing out through the sealing channel outlet 51*c* of the first sealing channel 51 flows out of the stem 37 through a stem exit coupling 50*f* provided on the lower end of the stem 37, flows through a channel composed of a second helical pipe 50*g* helically extending upward, passes through a channel composed of a vertical hole provided in the bonnet 33, and flows into the second sealing channel 52 provided on the front face of the bonnet 33.

As illustrated in FIG. 7, the second sealing channel 52 is a channel provided between the other outer and inner double sealing members 33*a*, 33*b* provided on the front face of the bonnet 33.

The second sealing channel 52 forms a channel for the inert gas G to annularly flow between the outer and inner double sealing members 33*a*, 33*b* in combination with the lower face of the body 32.

The second sealing channel 52 is provided with three partition walls 52*a*, 52*b* and 52*c* and divided into first to third three areas 52A, 52B and 52C by these three partition walls 52*a*. 52*b* and 52*c*.

The first to third areas 52A, 52B and 52C are respectively provided with sealing channel inlets 52Aa, 52Ba and 52Ca and sealing channel outlets 52Ab, 52Bb and 52Cb for the inert gas G.

The inert gas G passing through the first sealing channel 51 first flows into the second sealing channel 52 through the sealing channel inlet 52Aa of the first area 52A, flows through the first area 52A, flows through a channel composed of a vertical hole extending along the stem 37 from the sealing channel outlet 52Ab located around the stem 37, and flows into the third sealing channel 53 provided in the bellows flange 41 at the back side of the bonnet 33.

As illustrated in FIGS. 5B and 6B, the third sealing channel 53 is a channel provided between the outer and inner double sealing members 41*a* and 41*b* provided in the bellows flange 41.

More specifically, the third sealing channel 53 has a groove 53*a* which is formed in an annular shape on the back face of the bonnet 33 at a position between the double sealing members 41*a*, 41*b* of the bellows flange 41.

The third sealing channel 53 forms a channel for the inert gas G to annularly flow by a combination of the groove 53*a* and an upper face of the bellows flange 41 closing an opening of the groove 53*a* between the other outer and inner double sealing members 41*a*, 41*b*.

As illustrated in FIG. 6B, the third sealing channel 53 is provided with one sealing channel inlet 53*b* through which the inert gas G flows in from the upstream side, and one sealing channel outlet 53*c* through which the inert gas G flowing in through the sealing channel inlet 53*b* flows out to the downstream side.

The sealing channel inlet 53*b* and the sealing channel outlet 53*c* are provided at both ends of the groove 53*a* formed on the back face of the bonnet 33.

Thus, the inert gas G flowing in through the sealing channel inlet 53*b* of the third sealing channel 53 flows along the annular channel and then flows out to the downstream side through the sealing channel outlet 53*c*.

The inert gas G flowing out through the sealing channel outlet 53*c* of the third sealing channel 53 flows through a channel of a vertical hole from the back face of the bonnet 33 and flows into the fourth sealing channel 54 provided on the front face of the body 32, that is, a sealing face between the gate valve 30 and the transfer chamber 20.

As illustrated in FIG. 8, the fourth sealing channel 54 has an annular groove 54*a* formed on the face facing the transfer chamber 20 at a position between the outer and inner double sealing members 25*a* and 25*b* provided in the transfer chamber 20.

The fourth sealing channel 54 forms a channel for the inert gas G to annularly flow in combination with the face of the transfer chamber 20 facing the gate valve 30, more specifically, the face of the heat insulating connection part 24 facing the gate valve 30 between the outer and inner double sealing members 25*a* and 25*b*.

The fourth sealing channel 54 is provided with upper and lower partition walls 54*b* and 54*c* and divided into first and second two U-shaped areas 54A and 54B by the two partition walls 54*b* and 54*c*.

Note that, in the present embodiment, the transfer chamber 20 includes a gas circulation channel 27 (hereinbelow, referred to as "chamber side gas circulation channel") communicating with the gas circulation channel 50 provided in the gate valve 30.

As illustrated in FIG. 2, the chamber side gas circulation channel 27 includes two channels for outward and return paths which penetrate the inside of the heat insulating connection part 24 between the face facing the gate valve 30 and the face facing the chamber body 21 of the transfer chamber 20, and an annular chamber side sealing channel 27*a* between the outer and inner double sealing members 26*a*, 26*b* provided on the face of the heat insulating connection part 24 facing the chamber body 21 of the transfer chamber 20.

The fourth sealing channel 54 communicates with the chamber side gas circulation channel 27 as described above. Thus, the first area 54A of the fourth sealing channel 54 is provided with a sealing channel inlet 54Aa through which the inert gas G flowing through the third sealing channel 53 flows in and a gas feeding-out port 54Ab through which the inert gas G is fed out to the channel serving as the outward path of the chamber side gas circulation channel 27.

The second area 54B of the fourth sealing channel 54 is provided with a gas receiving port 54Ba through which the inert gas G flowing through the chamber side sealing channel 27*a* of the chamber side gas circulation channel 27 and being returned through the channel serving as the return path is received, and a sealing channel outlet 54Bb through which the inert gas G flows out to the downstream side of the gate valve 30.

The inert gas G from the first area 54A of the fourth sealing channel 54 flows through the chamber side gas circulation channel 27 of the transfer chamber 20 and the second area 54B of the fourth sealing channel 54, flows out through the sealing channel outlet 54Bb, and flows into the second area 52B of the second sealing channel 52 provided on the front face of the bonnet 33.

Then, the inert gas G flowing through the second area 52B of the second sealing channel 52 and flowing out through the sealing channel outlet 52Bb flows upward through a channel 50*h*1 composed of a vertical hole provided in the body 32 and flows into the fifth sealing channel 55 provided on the back face of the body cover 31.

As illustrated in FIG. 9, the fifth sealing channel 55 is a channel provided between the other outer and inner double sealing members 31*a*, 31*b* provided on the back face of the body cover 31.

The fifth sealing channel 55 forms a channel for the inert gas G to flow substantially annularly, more specifically, in a C shape between the other outer and inner double sealing members 31*a*, 31*b* in combination with the upper face of the body 32.

The fifth sealing channel 55 has one sealing channel inlet 55*b* through which the inert gas G flows in from the upstream side, one sealing channel outlet 55*c* through which the inert gas G flowing in through the sealing channel inlet 55*b* flows out to the downstream side, and a partition wall 55*a* which separates the sealing channel inlet 55*b* and the sealing channel outlet 55*c* near the sealing channel inlet 55*b* and the sealing channel outlet 55*c*.

The inert gas G annularly flowing along the fifth sealing channel 55 and flowing out through the sealing channel outlet 55*c* flows downward through a channel 50*h*2 composed of a vertical hole provided in the body 32, flows through the third area 52C of the second sealing channel 52 provided on the front face of the bonnet 33 and the sealing channel outlet 52Cb provided at an end position of the third area 52C, then flows through a channel 50*i* composed of a vertical hole of the body 32, further flows through a channel 50*j* composed of a horizontal hole of the body 32 and a channel 50*k* composed of a vertical hole of the body 32, passes through a channel 50*l* composed of a vertical hole of the bonnet 33, and passes through a channel composed of an exit L-shaped pipe 50*m* and is discharged through the outlet 50*n* outside the gate valve 30.

In the gas circulation channel 50 as described above, when the inert gas G flows in through the inlet 50*a*, the inert gas G flows through the first sealing channel 51 provided in the bellows ring 40, the first area 52A of the second sealing channel 52 provided in the bonnet 33, the third sealing channel 53 provided in the bellows flange 41, and the first area 54A of the fourth sealing channel 54 provided on the back face of the body 32, the back face facing the transfer chamber 20. The inert gas G is further fed out to the chamber side gas circulation channel 27 provided in the transfer chamber 20 and reaches the chamber side sealing channel 27*a*. Then, the inert gas G received from the chamber side gas circulation channel 27 flows through the second area 54B of the fourth sealing channel 54, the second area 52B of the second sealing channel 52 provided in the bonnet 33, and the fifth sealing channel 55 provided in the body cover 31, flows through the third area 52C of the second sealing channel 52 provided in the bonnet 33 at last, and is discharged through the outlet 50n.

Note that, in the present embodiment, in the first sealing channel 51 of the gas circulation channel 50, the inert gas G is split and flows, and the split flows then merge into one flow and the inert gas G flows out to the downstream side. However, the first sealing channel 51 may be configured as a single channel. For example, the first sealing channel may be a single C-shaped channel provided with one partition wall as with the fifth sealing channel.

When the first sealing channel is configured as a single channel in this manner, the gas circulation channel 50 may be configured as a single continuous channel from the inlet 50a to the outlet 50n for the inert gas G.

In the present embodiment, the gate valve 30 heats the valve disk 36 using a heater (not illustrated). Thus, heat-resistant perfluoroalkoxy alkane (PFA) tubes are used as the entrance L-shaped pipe 50b, the first helical pipe 50c, the second helical pipe 50g, and the exit L-shaped pipe 50m which constitute a part of the gas circulation channel 50.

Note that another heat-resistant material may be used as the entrance L-shaped pipe 50b, the first helical pipe 50c, the second helical pipe 50g, and the exit L-shaped pipe 50m. When heat resistance is not required, various materials may be used regardless of their heat resistance. Considering followability to the stem 37, a material having high flexibility such as urethane may be used.

Also, in the present embodiment, a channel (not illustrated) into which the inert gas G is supplied from the supply source of the inert gas G provided in the process chamber 10 is provided between the sealing members 12a and 12b which are doubly provided outside and inside surrounding the entire circumference of the substrate loading/unloading port 11a of the process chamber 10, and the inert gas G flows through this channel.

<Load Lock Chamber 60>

The load lock chamber 60 performs pressure adjustment between the substrate processing apparatus 1 in the vacuum atmosphere and the substrate supply and storage apparatus D in the atmospheric pressure atmosphere.

In the present embodiment, two load lock chambers 60 are provided as a transferring path for the semiconductor wafer W to move from the substrate supply and storage apparatus D to the substrate processing apparatus 1 and a transferring path for the semiconductor wafer W to return from the substrate processing apparatus 1 to the substrate supply and storage apparatus D.

Each of the load lock chambers 60 is depressurizable and connected to the transfer chamber 20 and the loader chamber D1 through a gate valve V1 and a gate valve V2, respectively.

<Control Unit 70>

The control unit 70 is connected to the substrate processing apparatus 1 and the substrate supply and storage apparatus D and controls each part of each apparatus.

The control unit 70 is implemented by, for example, a microcomputer and includes a controller (not illustrated) which includes a central processing unit (CPU), a read only memory (ROM), a random access memory (RAM), and the like and controls each part of the substrate processing apparatus 1 and the substrate supply and storage apparatus D, a user interface (not illustrated) which is implemented by a display or the like, and a storage unit (not illustrated) in which various programs including a control program are stored.

The control unit 70 controls the transfer chamber side transferring mechanism, the loader chamber side transferring mechanism, each gate valve 30 which connects each process chamber 10 and the transfer chamber 20, each gate valve V1 which connects each load lock chamber 60 and the transfer chamber 20, and each gate valve V2 which connects each load lock chamber 60 and the loader chamber D1 on the basis of the control program or the like stored in the storage unit.

<Operation of Entire Substrate Processing System>

Next, the operation of the entire substrate processing system will be described.

First, an unprocessed semiconductor wafer W is unloaded from the cassette container of the substrate housing part D2, positioned, and then transferred to the outward load lock chamber 60 by the loader chamber side transferring mechanism provided inside the loader chamber D1.

The semiconductor wafer W transferred to the load lock chamber 60 is loaded into the process chamber 10 for a predetermined process from the transfer chamber 20 by the transfer chamber side transferring mechanism provided inside the transfer chamber 20.

Then, the semiconductor wafer W processed inside the process chamber 10 is transferred from the process chamber 10 to the transfer chamber 20 by the transfer chamber side transferring mechanism. When a next process is to be performed in another process chamber 10, the semiconductor wafer W is loaded into the next process chamber 10 from the transfer chamber 20.

When all processes on the semiconductor wafer W in the respective process chambers 10 are completed in this manner, the processed semiconductor wafer W is transferred to the return load lock chamber 60 by the transfer chamber side transferring mechanism.

Then, the processed semiconductor wafer W transferred to the return load lock chamber 60 is housed in the cassette container of the substrate housing part D2 by the loader chamber side transferring mechanism.

In this operation of the entire substrate processing system, the gate valve 30 which connects each process chamber 10 and the transfer chamber 20 is opened only when loading and unloading of the semiconductor wafer W is performed between the process chamber 10 and the transfer chamber 20.

When the gate valve 30 is opened to perform loading and unloading of the semiconductor wafer W between the process chamber 10 and the transfer chamber 20, adjustment is performed to make the pressure inside the transfer chamber 20 substantially equal to the pressure inside the process chamber 10.

When evacuation is performed to adjust the pressure in the transfer chamber 20, as illustrated in FIG. 2, the evacuation is performed with the substrate loading/unloading port 11a of the process chamber 10 closed by the valve disk 36 of the gate valve 30 and the substrate loading/unloading port 24b of the transfer chamber 20 open.

At this time, the inert gas G flows into the gas circulation channel 50 through the inlet 50a, and the inert gas is continuously flowing from the inlet 50a to the outlet 50n.

That is, the inert gas G is flowing in the first to fifth sealing channels 51, 52, 53, 54, 55 and further in the chamber side sealing channel 27a described above.

When the evacuation of the transfer chamber 20 is completed, the gate valve 30 is opened. Specifically, the valve disk 36 is moved in the horizontal direction away from the substrate loading/unloading port 11a of the process chamber 10 and then further lowered by the actuator 35.

Note that, even when the stem 37 moves in response to the movement of the valve disk 36, the gas circulation channel 50 follows the movement of the stem 37 because the pipes are flexible due to the first and second helical pipes 50c and 50g.

The loading and unloading of the semiconductor wafer W can be performed between the process chamber 10 and the transfer chamber 20 by opening the gate valve 30 in this manner.

Effects of Embodiment

As described above, the gate valve 30 according to the present embodiment includes the first to fifth sealing channels 51, 52, 53, 54 and 55 provided between the sealing members 25a and 25b which are doubly provided outside and inside surrounding the entire circumference of the substrate loading/unloading port 24b of the transfer chamber 20 and between the other sealing members 31a, 31b, 33a, 33b, 40a, 40b, 41a and 41b which are doubly provided outside and inside in one or more parts inside the gate valve 30, and the gas circulation channel 50 which includes the first to fifth sealing channels 51, 52, 53, 54 and 55 and guides the inert gas G so that the inert gas G continuously flows from the inlet 50a to the outlet 50n for the inert gas G.

Accordingly, when the transfer chamber 20 provided with the outer and inner double sealing members 25a and 25b is depressurized, the inert gas G flowing in the sealing channel 54 between the outer sealing member 25a and the inner sealing member 25b prevents oxygen in the atmosphere transmitted through the outer sealing member 25a from being transmitted to the inner sealing member 25b. Thus, it is possible to prevent the oxygen transmitted through the outer sealing member 25a from entering the transfer chamber 20.

Also, inside the gate valve 30, the inert gas G flowing in the sealing channels 51, 52, 53, 55 between the other sealing members 31a, 31b. 33a, 33b, 40a, 40b, 41a and 41b prevents oxygen in the atmosphere from entering the inside of the gate valve 30. Thus, it is possible to prevent oxygen in the atmosphere from entering the transfer chamber 20 through the inside of the gate valve 30.

Furthermore, oxygen in the atmosphere transmitted through the outer sealing member 25a is taken into the flow of the inert gas G in the sealing channel 54 and discharged through the outlet 50n of the gas circulation channel 50. This eliminates the necessity of using the exhaust system of the process chamber 10 which is connected to the transfer chamber 20 to be depressurized through the gate valve 30 for discharging oxygen in the atmosphere, which prevents the atmospheric air from entering the process chamber 10 through the exhaust system. As a result, it is possible to prevent the oxygen from entering the transfer chamber 20 which is connected to the process chamber 10 through the gate valve 30.

The inert gas G is evenly spread across the plurality of sealing channels 51, 52, 53, 54 and 55 from the inlet 50a to the outlet 50n, which eliminates the necessity of providing a gas circulation channel having an inlet and an outlet in each of the sealing channels 51, 52, 53, 54 and 55.

Thus, it is possible to improve the airtightness of the transfer chamber 20. In addition, it is possible to reduce oxygen entering the inside of the transfer chamber 20 through the sealing members from the atmosphere while maintaining compactness.

According to the gate valve 30 according to the embodiment, the gas circulation channel 50 is a single continuous channel from the inlet 50a to the outlet 50n. Thus, the occurrence of pressure loss of the inert gas G caused by branching, merging, or the like of the gas circulation channel 50 is prevented, and the inert gas G flows through the plurality of sealing channels 51, 52, 53, 54 and 55 at a steady flow rate and velocity. Thus, it is possible to stably take in oxygen transmitted through the outer sealing members 25a, 31a, 33a, 40a and 41a and discharge the oxygen through the outlet 50n. As a result, it is possible to more effectively reduce oxygen from entering the inside of the transfer chamber 20 through the sealing members from the atmosphere.

According to the gate valve 30 according to the embodiment, the sealing channel 54 between the sealing members 25a and 25b which are doubly provided outside and inside in the transfer chamber 20 has the gas feeding-out port 54Ab through which the inert gas G is fed out to the chamber side sealing channel 27a between the sealing members 26a, 26b which are doubly provided outside and inside the face facing the chamber body 21 of the heat insulating connection part 24 as a sealing part inside the transfer chamber 20, and the gas receiving port 54Ba through which the inert gas G returned from the sealing part inside the transfer chamber 20 is received. This makes it possible to extend the gas circulation channel 50 provided in the gate valve 30, the gas circulation channel 50 being continuous from the inlet 50a to the outlet 50n, to the sealing part inside the transfer chamber 20. Thus, it is also possible to increase the airtightness inside the transfer chamber 20 with a simple and compact configuration.

The substrate processing apparatus 1 according to the embodiment includes the gate valve 30 which openably and closably connects the process chamber 10 and the transfer chamber 20. The gate valve 30 includes the sealing channels between the sealing members 25a, 25b which are doubly provided outside and inside in the transfer chamber 20 and between the other sealing members 31a, 31b, 33a. 33b, 40a, 40b, 41a, 41b which are doubly provided outside and inside in one or more parts inside the gate valve 30, and the gas circulation channel 50 which includes the first to fifth sealing channels 51, 52, 53, 54 and 55 and guides the inert gas G so that the inert gas G continuously flows from the inlet 50a to the outlet 50n for the inert gas G.

Accordingly, when the transfer chamber 20 provided with the double sealing members 25a and 25b is depressurized, the inert gas G flowing in the sealing channel 54 between the outer sealing member 25a and the inner sealing member 25b prevents oxygen in the atmosphere transmitted through the outer sealing member 25a from being transmitted to the inner sealing member 25b. Thus, it is possible to prevent the oxygen transmitted through the outer sealing member 25a from entering the transfer chamber 20.

Also, inside the gate valve 30, the inert gas G flowing in the sealing channels 51, 52, 53 and 55 between the other sealing members 31a, 31b, 33a, 33b, 40a, 40b. 41a and 41b prevents oxygen in the atmosphere from entering the inside of the gate valve 30. Thus, it is possible to prevent the oxygen from entering the transfer chamber 20 through the inside of the gate valve 30.

Furthermore, oxygen in the atmosphere transmitted through the outer sealing members 25a. 31a, 33a, 40a and 41a is taken into the flow of the inert gas G in the sealing channels 51, 52, 53, 54 and 55 and discharged through the outlet 50n of the gas circulation channel 50. This eliminates the necessity of using the exhaust system of the process chamber 10 which is connected to the transfer chamber 20 to be depressurized through the gate valve 30 for discharging oxygen in the atmosphere, which also prevents oxygen in the atmosphere from entering the process chamber 10 through the exhaust system. As a result, it is possible to prevent the oxygen from entering the transfer chamber 20 which is connected to the process chamber 10 through the gate valve 30.

The inert gas G is evenly spread across the plurality of sealing channels 51, 52, 53, 54 and 55 from the inlet 50a to the outlet 50n, which eliminates the necessity of providing a gas circulation channel having an inlet and an outlet in each of the sealing channels 51, 52, 53, 54 and 55.

Thus, it is possible to improve the airtightness of the transfer chamber 20. In addition, it is possible to reduce oxygen entering the inside of the transfer chamber 20 through the sealing members 25a, 31a, 33a, 40a and 41a from the atmosphere while maintaining compactness.

The substrate processing method according to the embodiment depressurizes the transfer chamber 20 in a state in which the inert gas G flows through the gas circulation channel 50, the gas circulation channel 50 including the sealing channels between the sealing members 25a and 25b doubly provided outside and inside in the transfer chamber 20 connected to the process chamber 10 by the gate valve 30 and between the other sealing members 31a, 31b, 33a. 33b. 40a, 40b. 41a and 41b doubly provided outside and inside in one or more parts inside the gate valve 30 and being configured to guide the inert gas G so that the inert gas G continuously flows from the inlet 50a to the outlet 50n.

Accordingly, when the transfer chamber 20 provided with the double sealing members 25a, 25b is depressurized, the inert gas G flowing in the sealing channel 54 between the outer sealing member 25a and the inner sealing member 25b prevents oxygen in the atmosphere transmitted through the outer sealing member 25a from being transmitted to the inner sealing member 25b. Thus, it is possible to prevent the oxygen transmitted through the outer sealing member 25a from entering the transfer chamber 20.

Also, inside the gate valve 30, the inert gas G flowing in the sealing channels 51, 52, 53, 55 between the other sealing members 31a, 31b, 33a, 33b, 40a, 40b, 41a and 41b prevents oxygen in the atmosphere from entering the inside of the gate valve 30. Thus, it is possible to prevent the oxygen from entering the transfer chamber 20 through the inside of the gate valve 30.

Furthermore, oxygen in the atmosphere transmitted through the outer sealing member 25a is taken into the flow of the inert gas G in the sealing channel 54 and discharged through the outlet 50n of the gas circulation channel 50. This eliminates the necessity of using the exhaust system of the process chamber 10 which is connected to the transfer chamber 20 to be depressurized through the gate valve 30 for discharging oxygen in the atmosphere, which also prevents oxygen in the atmosphere from entering the process chamber 10 through the exhaust system. As a result, it is possible to prevent oxygen in the atmosphere from entering the transfer chamber 20 which is connected to the process chamber 10 through the gate valve 30.

The inert gas G is evenly spread across the plurality of sealing channels 51, 52, 53, 54 and 55 from the inlet 50a to the outlet 50n, which eliminates the necessity of providing a gas circulation channel having an inlet and an outlet in each of the sealing channels 51, 52, 53, 54 and 55.

Thus, it is possible to improve the airtightness of the transfer chamber 20. In addition, it is possible to reduce oxygen entering the inside of the transfer chamber 20 through the sealing members 25a, 31a, 33a, 40a and 41a from the atmosphere while maintaining compactness.

Modification 1

Next, Modification 1 of the gate valve 30 according to the embodiment will be described with reference to FIG. 10.

Figure 10:
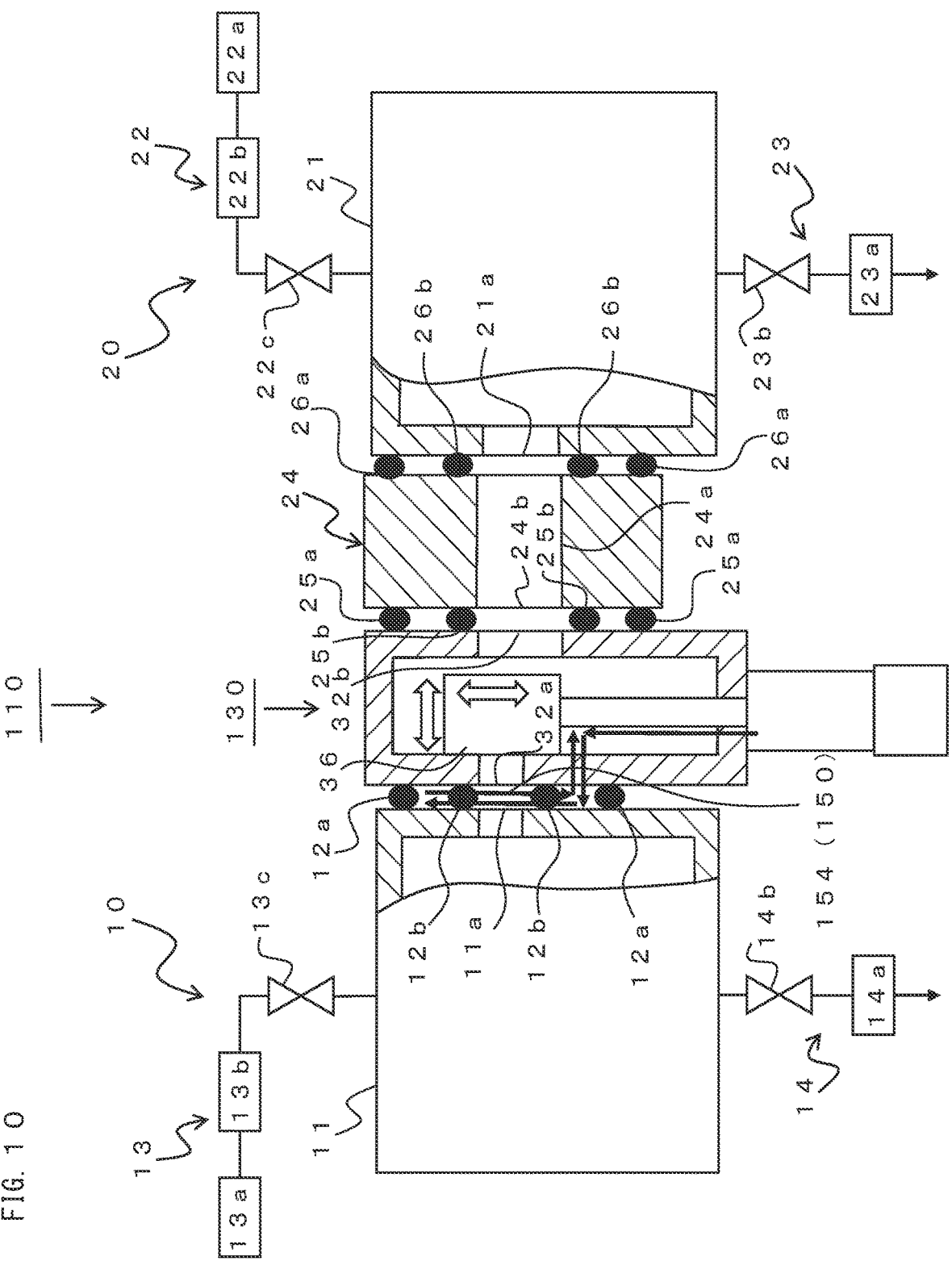
FIG. 10 is a diagram for describing a schematic configuration of a substrate processing apparatus with a gate valve according to Modification 1 of the embodiment incorporated therein.

FIG. 10 is a diagram for describing a schematic configuration of a substrate processing apparatus 110 with a gate valve 130 according to Modification 1 of the embodiment incorporated therein.

Note that, in Modification 1, the same parts as those in the embodiment will be designated by the same reference signs as those in the embodiment to omit repetitive description.

The gate valve 130 of Modification 1 differs from the gate valve 30 of the embodiment in that the gate valve 130 is provided with a fourth sealing channel 154 of a gas circulation channel 150 on a face facing the process chamber 10.

As illustrated in FIG. 10, the fourth sealing channel 154 has the annular groove 54a formed on the face facing the process chamber 10 at a position between the outer and inner double sealing members 12a and 12b provided in the process chamber 10.

The fourth sealing channel 154 forms a channel for the inert gas G to annularly flow in combination with the face of the process chamber 10 facing the gate valve 30 between the outer and inner double sealing members 12a and 12b.

Note that, in Modification 1, the fourth sealing channel 154 is not divided into two areas, but forms a single channel and returns into the gate valve 30 without passing through the inside of the process chamber 10.

Effects of Modification 1

According to the gate valve 130 according to Modification 1, when the process chamber 10 provided with the double sealing members 12a, 12b is depressurized, the inert gas G flowing in the sealing channel 154 between the outer sealing member 12a and the inner sealing member 12b prevents oxygen in the atmosphere transmitted through the outer sealing member 12a from being transmitted to the inner sealing member 12b. Thus, it is possible to prevent the oxygen in the atmosphere transmitted through the outer sealing member 12a from entering the process chamber 10.

Also, inside the gate valve 130, the inert gas G flowing in the sealing channels 51, 52, 53, 55 between the other sealing members 31a, 31b, 33a, 33b, 40a, 40b, 41a and 41b prevents oxygen in the atmosphere from entering the inside of the gate valve 130. Thus, it is possible to prevent the oxygen in the atmosphere from entering the process chamber 10 through the inside of the gate valve 130.

Furthermore, atmospheric air transmitted through the outer sealing members 12a, 31a, 33a, 40a, 41a is taken into the flow of the inert gas G in the sealing channel 154 and discharged through the outlet 50n of the gas circulation channel 150. This eliminates the necessity of using the exhaust system of the transfer chamber 20 which is connected to the process chamber 10 to be depressurized through the gate valve 130 for discharging oxygen in the atmosphere, which prevents oxygen in the atmosphere from entering the transfer chamber 20 through the exhaust system. As a result, it is possible to prevent the oxygen from entering the process chamber 10 which is connected to the transfer chamber 20 through the gate valve 130.

The inert gas G is evenly spread across the plurality of sealing channels 51, 52, 53, 154 and 55 from the inlet 50a to the outlet 50n, which eliminates the necessity of providing a gas circulation channel having an inlet and an outlet in each of the sealing channels 51, 52, 53, 154 and 55.

Thus, it is possible to improve the airtightness of the process chamber 10. In addition, it is possible to reduce oxygen entering the inside of the process chamber 10 through the sealing members 12a, 31a, 33a, 40a and 41a from the atmosphere while maintaining compactness.

Modification 2

Figure 11:
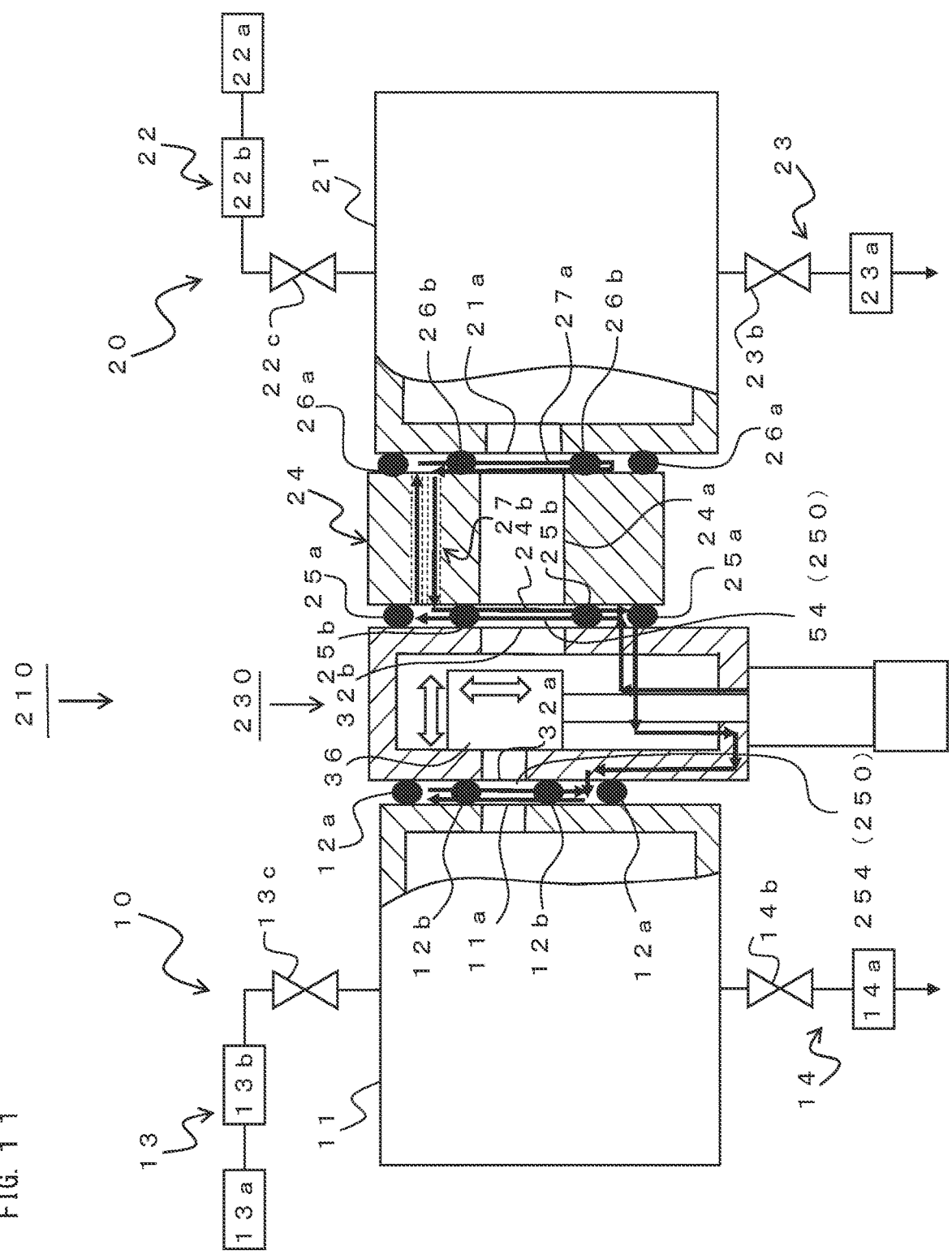
FIG. 11 is a diagram for describing a schematic configuration of a substrate processing apparatus with a gate valve according to Modification 2 of the embodiment incorporated therein.

Next, Modification 2 of the gate valve 30 according to the embodiment will be described with reference to FIG. 11. FIG. 11 is a diagram for describing a schematic configuration of a substrate processing apparatus 210 with a gate valve 230 according to Modification 2 of the embodiment incorporated therein.

Note that, in Modification 2, the same parts as those in the embodiment will be designated by the same reference signs as those in the embodiment to omit repetitive description.

The gate valve 230 of Modification 2 differs from the gate valve 30 of the embodiment in that a gas circulation channel 250 is provided with a sealing channel 254 (hereinbelow, referred to as "chamber side sealing channel") provided on the face facing the process chamber 10 in addition to the fourth sealing channel 54 provided on the face facing the transfer chamber 20, that is, the sealing channels are provided on both faces of the gate valve 230.

The chamber side sealing channel 254 is provided with a channel communicating with a channel through which the inert gas G flowing through the fourth sealing channel 54 and being returned into the gate valve 230 flows between the sealing members 12a. 12b doubly provided outside and inside surrounding the entire circumference of the substrate loading/unloading port 11a of the process chamber 10.

Effects of Modification 2

According to the gate valve 230 according to Modification 2, when the process chamber 10 or the transfer chamber 20 provided with the double sealing members 12a, 12b, 25a and 25b is depressurized, the inert gas G flowing in the sealing channel 254 and 54 between the outer sealing member 12a and 25a and the inner sealing member 12b, 25b prevents oxygen in the atmosphere transmitted through the outer sealing member 12a, 25a from being transmitted to the inner sealing member 12b and 25b. Thus, it is possible to prevent the oxygen in the atmosphere transmitted through the outer sealing member 12a, 25a from entering the process chamber 10 or the transfer chamber 20.

Also, inside the gate valve 230, the inert gas G flowing in the sealing channels 51, 52, 53 and 55 between the other sealing members 31a, 31 b, 33a, 33b, 40a, 40b, 41a and 41b prevents oxygen in the atmosphere from entering the inside of the gate valve 230. Thus, it is possible to prevent atmospheric air from entering the process chamber 10 or the transfer chamber 20 through the inside of the gate valve 230.

Furthermore, oxygen in the atmosphere transmitted through the outer sealing members 12a, 25a, 31a, 33a, 40a, 41a is taken into the flow of the inert gas G in the sealing channels 51, 52, 53, 54, 254 and 55 and discharged through the outlet 50n of the gas circulation channel 250. This eliminates the necessity of using the exhaust system of one of the process chamber 10 or the transfer chamber 20 which is connected to the other of the process chamber 10 or the transfer chamber 20 to be depressurized through the gate valve 230 for discharging oxygen in the atmosphere, which prevents the oxygen in the atmosphere from entering the process chamber 10 or the transfer chamber 20 through the exhaust system. As a result, it is possible to prevent the oxygen from entering the process chamber 10 or the transfer chamber 20 connected through the gate valve 230.

The inert gas G is evenly spread across the plurality of sealing channels 51, 52, 53, 54, 254 and 55 from the inlet 50a to the outlet 50n, which eliminates the necessity of providing a gas circulation channel having an inlet and an outlet in each of the sealing channels 51, 52, 53, 54, 254 and 55.

Thus, it is possible to improve the airtightness of the process chamber 10 and the transfer chamber 20. In addition, it is possible to reduce oxygen entering the inside of the process chamber 10 and the transfer chamber 20 through the sealing members 12a, 25a. 31a, 33a, 40a and 41a from the atmosphere while maintaining compactness.

While the embodiment of the present disclosure has been described above, the present disclosure is not limited to the above-mentioned embodiment and can be variously changed without departing from the gist thereof.

For example, while, in the above embodiment, the partition walls 52a, 52b, 52c, 54b and 54c are provided in the second and fourth sealing channels 52, 54 to divide the channels into the plurality of areas, the disclosed technique is not limited thereto. For example, the upper partition wall 54b of the fourth sealing channel 54 may be eliminated to change the two divided areas of the channel into one area so that the inert gas G is returned into the gate valve 30 without being fed to the transfer chamber 20.

For example, while, in the above embodiment, the transfer chamber 20 is provided with the heat insulating connection part 24 which connects the chamber body 21 and the gate valve 30, the transfer chamber 20 may be connected to the gate valve 30 through the substrate loading/unloading port 21a of the chamber body 21 without providing the heat insulating connection part 24.

For example, while, in the above embodiment, the gas circulation channel 50 is a substantially single continuous channel from the inlet 50a to the outlet 50n for the inert gas G (only the first sealing channel 51 is divided into two channels), the disclosed technique is not limited thereto. That is, it is only required that the gas circulation channel 50 include a plurality of sealing channels and can guide the inert gas G so that the inert gas G continuously flows from the inlet to the outlet for the inert gas G. For example, the gas circulation channel 50 may branch at a plurality of positions from the inlet 50a to the outlet 50n.

For example, while, in the above embodiment, the substrate processing apparatus 1 processes the semiconductor wafer W, the disclosed technique is not limited thereto. For example, the substrate processing apparatus 1 may process a substrate such a liquid crystal substrate or a solar panel substrate.

For example, while, in the above embodiment, the inert gas G is passed through the gas circulation channel 50, the disclosed technique is not limited thereto. For example, the gas circulation channel 50 may be evacuated through the outlet 50n with the inlet 50a closed.

In this case, the sealing channels 51, 52, 53, 54 and 55 are in a vacuum state. Thus, it is possible to achieve the same effects as in the embodiment in which the inert gas G flows through the sealing channels 51, 52, 53, 54 and 55.

It should be understood that each embodiment disclosed herein is not restrictive but illustrative in all aspects. Omissions, replacements, and changes in various forms may be made on the above-mentioned embodiment without departing from the appended claims and the gist thereof.

What is claimed is:

1. A gate valve having a first face configured to face a depressurizable vacuum processing chamber and a second face configured to face a depressurizable vacuum preliminary chamber, the vacuum processing chamber and the vacuum preliminary chamber each having a substrate loading/unloading port and an annular sealing member surrounding an entire circumference of the substrate loading/unloading port, the first and second faces being configured to abut on the annular sealing members, the substrate loading/unloading ports being disposed facing each other, the gate valve being configured to openably and closably connect the vacuum processing chamber and the vacuum preliminary chamber, the gate valve comprising:

sealing channels, wherein the annular sealing member of at least one of the vacuum processing chamber and the vacuum preliminary chamber includes a first inner sealing member and a first outer sealing member surrounding the entire circumference of the substrate loading/unloading port of the at least one of the vacuum processing chamber or the vacuum preliminary chamber, the first outer sealing member being closer to an exterior of the gate valve than the first inner sealing member, the sealing channels being provided between the first inner and outer sealing members, and between a second inner sealing member and a second outer sealing member arranged in one or more parts inside the gate valve, the second outer sealing member being closer to an exterior of the gate valve than the second inner sealing member; and a gas circulation channel including a plurality of the sealing channels and extending from an inlet, through which inert gas flows from an outside of the gate valve, to an outlet through which inert gas flows to the outside of the gate valve, the gas circulation channel being configured to flow inert gas continuously from the inlet to the outlet.

2. The gate valve according to claim 1, wherein the gas circulation channel is a single continuous channel from the inlet to the outlet.

3. A gate valve having a first face configured to face a depressurizable vacuum processing chamber and a second face configured to face a depressurizable vacuum preliminary chamber, the vacuum processing chamber and the vacuum preliminary chamber each having a substrate loading/unloading port and an annular sealing member surrounding an entire circumference of the substrate loading/unloading port, the first and second faces being configured to abut on the annular sealing members, the substrate loading/unloading ports being disposed facing each other, the gate valve being configured to openably and closably connect the vacuum processing chamber and the vacuum preliminary chamber, the gate valve comprising:

sealing channels, wherein the annular sealing member of at least one of the vacuum processing chamber and the vacuum preliminary chamber includes a first inner sealing member and a first outer sealing member surrounding the entire circumference of the substrate loading/unloading port of the at least one of the vacuum processing chamber or the vacuum preliminary chamber, the first outer sealing member being closer to an exterior of the gate valve than the first inner sealing member, the sealing channels being provided between the first inner and outer sealing members, and between a second inner sealing member and a second outer sealing member arranged in one or more parts inside the gate valve, the second outer sealing member being closer to an exterior of the gate valve than the second inner sealing member; and a gas circulation channel including a plurality of the sealing channels and being configured to guide inert gas so that the inert gas continuously flows from an inlet to an outlet for the inert gas, wherein the first inner and outer sealing members are arranged so as to surround the entire circumference of the substrate loading/unloading port of the vacuum preliminary chamber, and the sealing channel between the first inner and outer sealing members has a gas feeding-out port through which inert gas is fed out to a sealing part inside the vacuum preliminary chamber, and a gas receiving port through which the inert gas returned from the sealing part inside the vacuum preliminary chamber is received.

4. A substrate processing apparatus comprising:

a depressurizable vacuum processing chamber having a substrate loading/unloading port and an annular sealing member surrounding an entire circumference of the substrate loading/unloading port;

a depressurizable vacuum preliminary chamber having a substrate loading/unloading port and an annular sealing member surrounding an entire circumference of the substrate loading/unloading port, the substrate loading/unloading port of the vacuum preliminary chamber being disposed so as to face the substrate loading/unloading port of the vacuum processing chamber; and a gate valve having a first face facing the vacuum processing chamber and a second face facing the vacuum preliminary chamber, each of the first and second faces abutting on the annular sealing members of the vacuum processing chamber and the vacuum preliminary chamber, the annular sealing member of at least one of the vacuum processing chamber or and the vacuum preliminary chamber includes a first inner sealing member and a first outer sealing member surrounding the entire circumference of the substrate loading/unloading port of the at least one of the vacuum processing chamber or the vacuum preliminary chamber, the first outer sealing member being closer to an exterior of the gate valve than the first inner sealing member, the gate valve openably and closably connecting the vacuum processing chamber and the vacuum preliminary chamber, wherein the gate valve includes sealing channels between the first inner and outer sealing members, and between a second inner sealing member and a second outer sealing member arranged in one or more parts inside the gate valve, and a gas circulation channel including a plurality of the sealing channels and extending from an inlet, through which inert gas flows from an outside of the gate valve, to an outlet through which inert gas flows to the outside of the gate valve, the gas circulation channel being configured to flow inert gas continuously from the inlet to the outlet.

5. A substrate processing method for processing a substrate in a depressurizable vacuum processing chamber of a substrate processing apparatus by loading the substrate into and unloading the substrate from the vacuum processing chamber through a gate valve of the substrate processing apparatus, wherein the vacuum processing chamber has a substrate loading/unloading port and an annular sealing member surrounding an entire circumference of the substrate loading/unloading port, wherein the substrate processing apparatus includes a depressurizable vacuum preliminary chamber having a substrate loading/unloading port and an annular sealing member surrounding an entire circumference of the substrate loading/unloading port, the substrate loading/ unloading port of the vacuum preliminary chamber being disposed so as to face the substrate loading/unloading port of the vacuum processing chamber, wherein the gate valve has a first face facing the vacuum processing chamber and a second face facing the vacuum preliminary chamber, each of the first and second faces abutting on the annular sealing members of the vacuum processing chamber and the vacuum preliminary chamber, the annular sealing member of at least one of the vacuum processing chamber and the vacuum preliminary chamber includes a first inner sealing member and a first outer sealing member surrounding the entire circumference of the substrate loading/unloading port of the at least one of the vacuum processing chamber or the vacuum preliminary chamber, the first outer sealing member being closer to an exterior of the gate valve than the first inner sealing member, the gate valve openably and closably connecting the vacuum processing chamber and the vacuum preliminary chamber, wherein the gate valve includes sealing channels between the first inner and outer sealing members, and between a second inner sealing member and a second outer sealing member arranged in one or more parts inside the gate valve, and a gas circulation channel including a plurality of the sealing channels and extending from an inlet, through which inert gas flows from an outside of the gate valve, to an outlet through which inert gas flows to the outside of the gate valve, the gas circulation channel being configured to flow inert gas continuously from the inlet to the outlet, the method comprising:

depressurizing the vacuum processing chamber or the vacuum preliminary chamber in a state in which inert gas flows continuously through the gas circulation channel, from the inlet to the outlet, or in a state in which the gas circulation channel is evacuated.

* * * * *